United States Patent [19]
Powers et al.

[11] Patent Number: 5,502,993
[45] Date of Patent: Apr. 2, 1996

[54] METHOD OF AND APPARATUS FOR PUNCHING AND BENDING A LITHOGRAPHIC PLATE

[75] Inventors: John W. Powers, Battlefield; Kelly T. McMasters, Springfield, both of Mo.

[73] Assignee: Western Litho Plate & Supply Co., St. Louis, Mo.

[21] Appl. No.: 257,380

[22] Filed: Jun. 9, 1994

Related U.S. Application Data

[63] Continuation-in-part of Ser. No. 76,411, Jun. 11, 1993, Pat. No. 5,454,247.

[51] Int. Cl.$^6$ ........................................... B21D 5/04
[52] U.S. Cl. ............................... 72/37; 72/319; 72/320; 72/420
[58] Field of Search ................... 72/306, 319, 320, 72/322, 323, 31–37, 420, 379.2

[56] References Cited

U.S. PATENT DOCUMENTS

| | | | |
|---|---|---|---|
| 1,192,797 | 7/1916 | Salmon, Jr. | 72/320 |
| 3,735,627 | 5/1973 | Eburn, Jr. | 72/319 |
| 3,786,666 | 1/1974 | York, Jr. | 72/420 |
| 4,365,500 | 12/1982 | Klukow | 72/319 |
| 4,594,868 | 6/1986 | Takeuchi et al. | 72/37 |
| 5,007,264 | 4/1991 | Haack | 72/320 |
| 5,193,690 | 3/1993 | Powers et al. | 101/463.1 |
| 5,255,607 | 10/1993 | Nishiyama et al. | 101/463.1 |

OTHER PUBLICATIONS

K&F Printing Systems Int'l, *Vision Bender*, 1993, brochure, admitted as prior art.
Tech Management, *POSTPress*, "K&F Printing Systems", News, Inc., Jun. 1993, p. 58, admitted as prior art.
K&F Printing Systems Int'l, *In–Line Vision Punch Bender*, undated, brochure, admitted as prior art.
"LA Times Purchases Six K&F In–Line Binders", *Newspapers & Technology*, Jun. 1993, admitted as prior art.

*Primary Examiner*—Lowell A. Larson
*Assistant Examiner*—Donald M. Gurley
*Attorney, Agent, or Firm*—Senniger, Powers, Leavitt & Roedel

[57] ABSTRACT

Apparatus for bending a lithographic plate having an image thereon, comprising an inspection system for (a) inspecting a plate held on a table at an inspection station, (b) determining the extent to which the plate needs to be adjusted relative to a predetermined reference position, and (c) generating a signal indicative of any such adjustment. A first positioning mechanism responsive to the signal automatically moves the table to position a plate on the table for a bending operation. The apparatus also includes a bending mechanism for bending a plate on the table when the plate is positioned for a bending operation, and a control system for selectively operating said apparatus in either an inspection mode of operation in which the inspection system and the first positioning mechanism are operable to inspect the plate on the table and then to move the table to position the plate for said bending operation, or in an inspection bypass mode of operation in which a second positioning mechanism is adapted to position the plate for a bending operation without prior inspection of the plate.

10 Claims, 14 Drawing Sheets

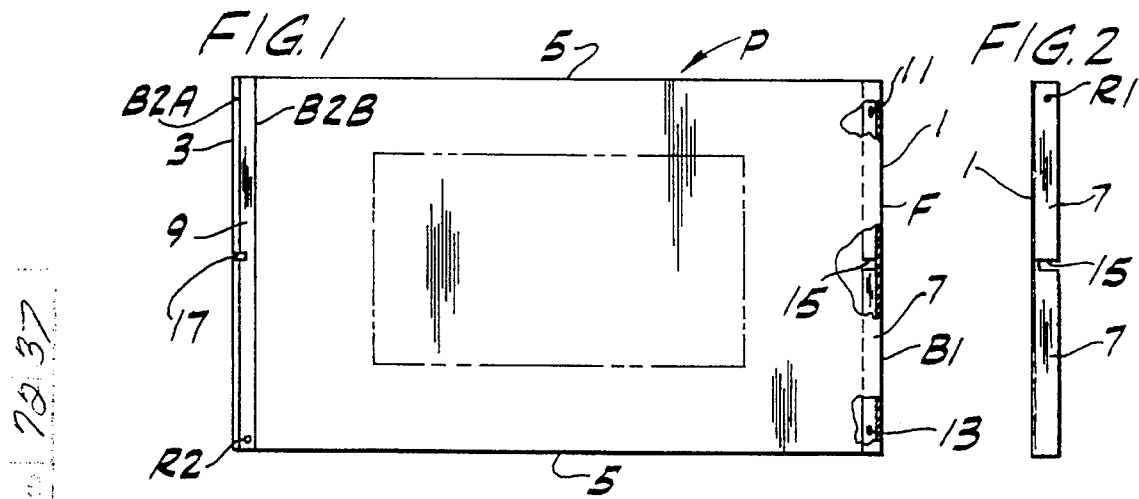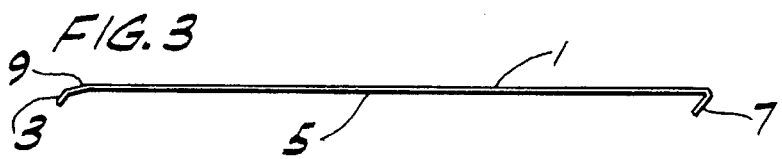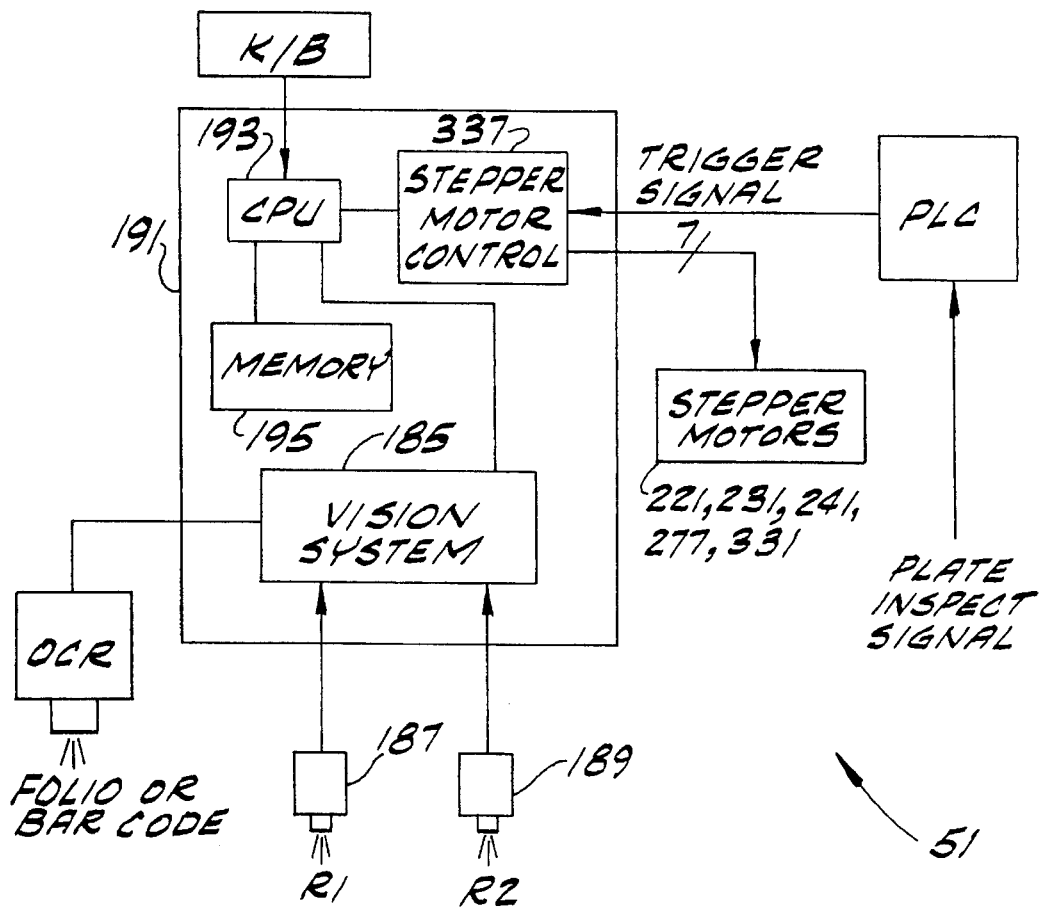

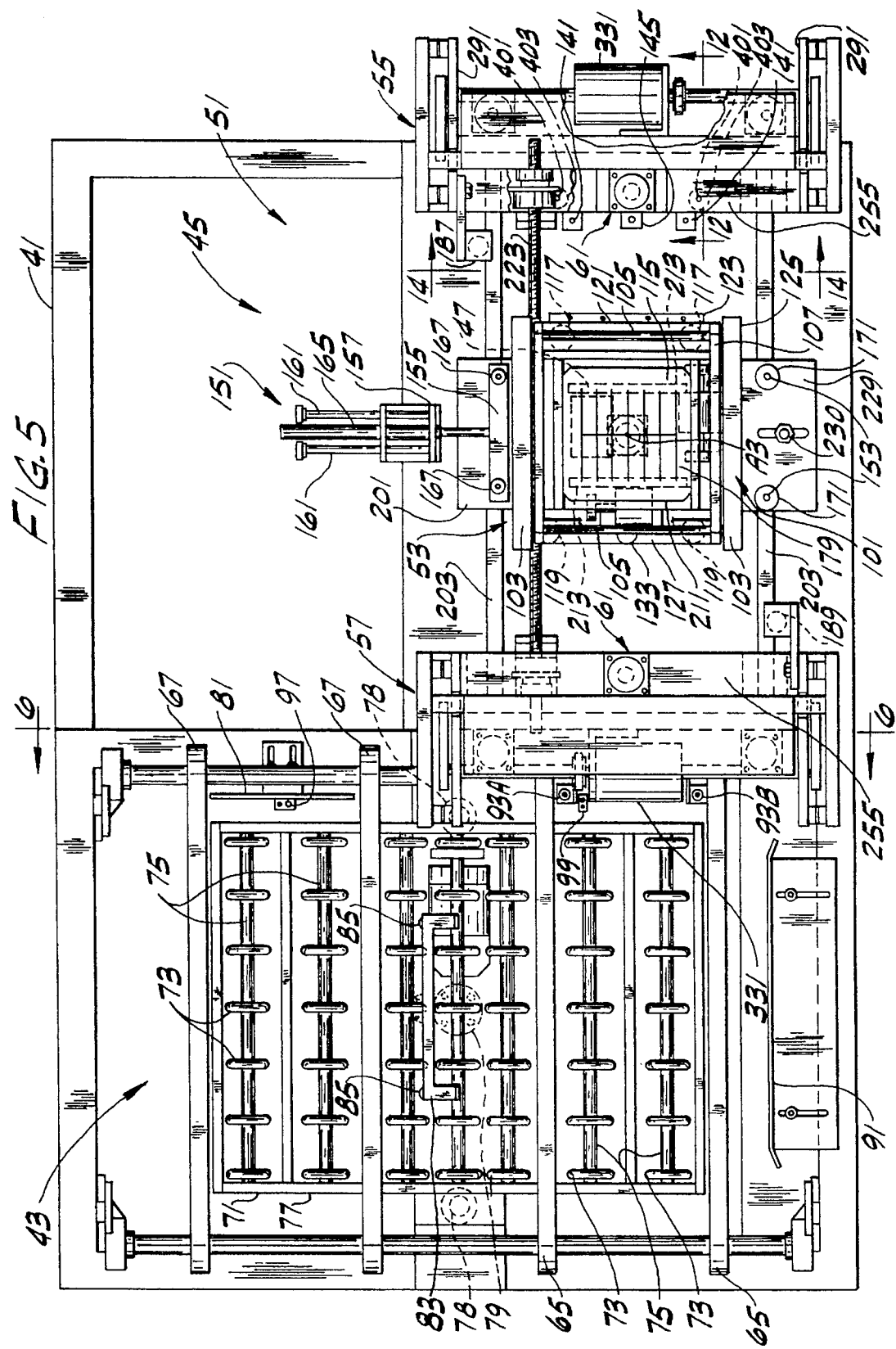

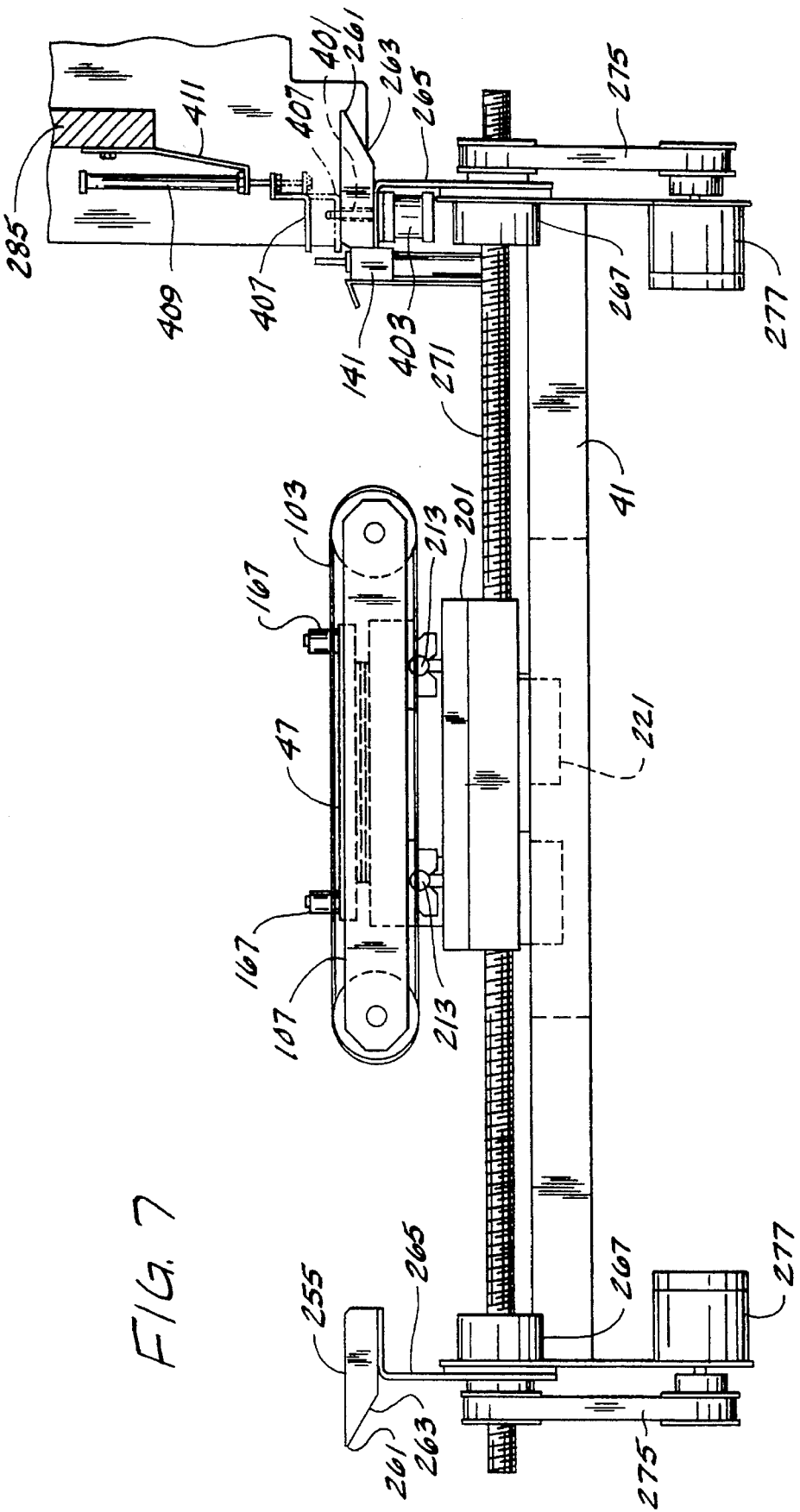

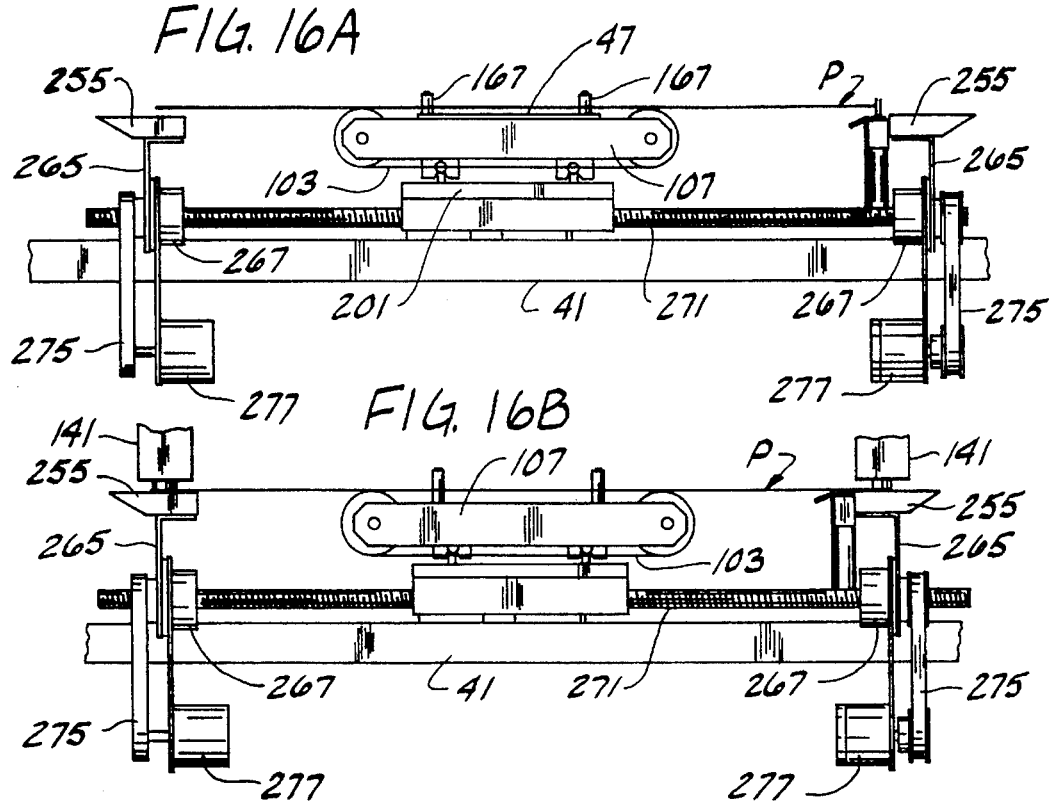

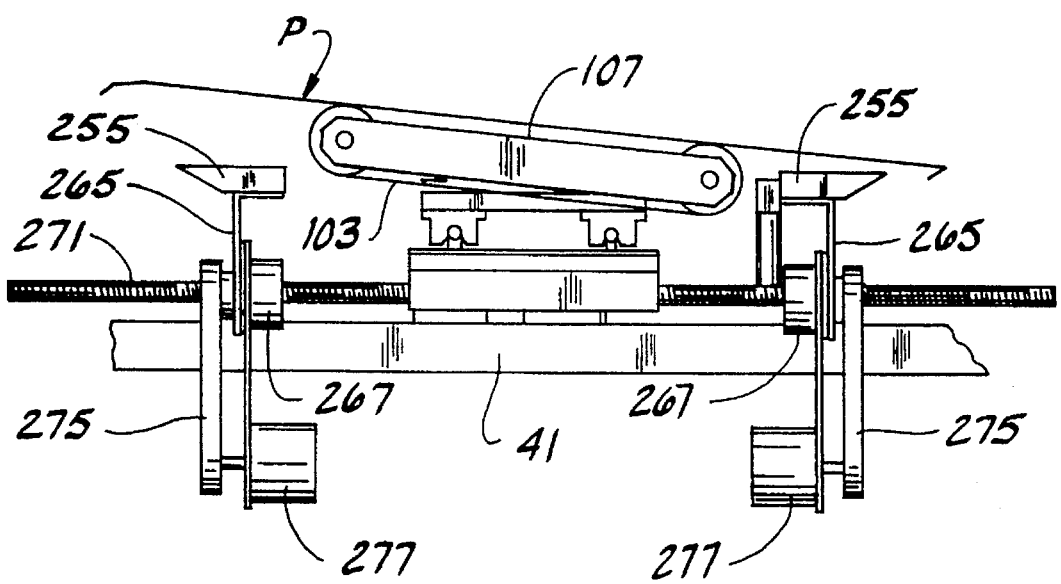

5,502,993

METHOD OF AND APPARATUS FOR PUNCHING AND BENDING A LITHOGRAPHIC PLATE

CROSS-REFERENCE TO RELATED APPLICATION

This is a continuation-in-part of application Ser. No. 08/076,411, filed Jun. 11, 1993, now U.S. Pat. No. 5,454,247.

BACKGROUND OF THE INVENTION

The present invention relates generally to the processing of lithographic plates, and more particularly to equipment for punching and bending lithographic plates after they have been through an exposure operation.

This invention has particular (albeit not exclusive) application to lithographic plates used in high-speed press operations to print multi-color images. In such operations, it is essential that the lithographic plates printing different colors be mounted in precise position so that the color images superposed on the printed surface (e.g., newspaper stock) are in exact registration to provide the desired clarity and sharpness. Otherwise, the final image will have ghost-like characteristics.

As will be understood by those skilled in this field, a lithographic plate is formed with flanges and openings which enable it to be mounted on a press. The configuration of these flanges and openings is critical to whether the aforementioned exact registration will be achieved. In conventional lithographic plate punching and bending equipment, a plate is punched and bent so that the image on the plate is generally "square" with the plate when the plate is mounted on the press. However, this does not necessarily result in the desired exactness of registration. For example, if the press on which the plate is mounted is out of alignment with another press in the line, or if the plate-mounting cylinder of the press is slightly deformed, the image printed by the plate on that press will be slightly out of registration with respect to other images printed by plates on other presses in the line. Also, in high volume applications where several identical plates are mounted side-by-side on each press, the multiple side-by-side images formed by the plates may tend to "fan out" as the web of printed material progresses from one press to the next. As a result, the images printed by the plates on the next press may not be in precise registration with the images previously printed on the substrate.

Conventional punching and bending equipment does not take into account any misalignment or deformity associated with the particular press on which a plate is to be mounted. Nor does this equipment compensate for "fan out", or for other factors which can produce images which are out of registration with respect to one another. There is a need, therefore, for equipment which can "match" a plate to the particular press on which it will be mounted so that the image printed by the plate is positioned to achieve the desired preciseness of image registration.

Another deficiency of conventional plate punching and bending equipment is that such equipment is not readily adjustable to vary the angle at which the plate mounting flanges are bent (this angle may vary between presses). Similarly, it is also time-consuming to adjust the "bend-to-bend" dimension of a plate (i.e., the distance from the head end of the plate to the tail end of the plate). There is a need, therefore, for such equipment which is readily adjustable in these respects, yet highly accurate.

SUMMARY OF THE INVENTION

Among the several objects of this invention may be noted the provision of an improved apparatus for and method of punching and bending lithographic plates, the apparatus and method being capable of matching a plate to a particular press so that when the plate is subsequently mounted on the press, it is oriented to provide an accurate printed image on the print surface; the provision of such apparatus and method which automatically compensate for press misalignment and "fan out"; the provision of such apparatus and method which utilize stepping motors for increased accuracy and ease of adjustment in the positioning of a plate prior to the punching and bending operation; the provision of bending apparatus which is readily adjustable for varying the angular configuration of the mounting flanges on a plate, and the "bend-to-bend" dimension of a plate, while maintaining a high degree of accuracy; and the provision of bending apparatus which can be selectively operated in either an inspection mode in which a plate is inspected and then, based on the inspection, automatically positioned by a first positioning mechanism for a bending operation, or in an inspection bypass mode in which the plate is positioned by a second positioning mechanism for a bending operation without prior inspection of the plate.

Briefly, one aspect of the method of this invention involves punching and bending a lithographic plate to match a particular press so that when the plate is subsequently mounted on that particular press, it is oriented to print a properly positioned image on a print surface. The plate has thereon indicia identifying the plate and at least one registration mark indicative of the position of an image on the plate relative to the plate. The aforementioned method comprises the steps of (A) conveying lithographic plates one after another to an inspection station, (B) inspecting a plate at the inspection station to identify the plate by means of said indicia, and to determine the position of said at least one registration mark on the plate, (C) comparing the position of said at least one registration mark to a predetermined reference position, (D) identifying the particular press on which the plate, as identified by said indicia, is to be mounted, (E) determining whether the position of said at least one registration mark on the plate is to be adjusted relative to said reference position to a compensating position to compensate for potential misalignment of the plate image on a print surface when the plate is mounted on said particular press, (F) positioning the plate at said inspection station in a final plate punching position in which said at least one registration mark on the plate is either in said reference position in the event it is determined there is to be no compensating adjustment, or in said compensating position in the event it is determined there is to be a compensating adjustment, (G) punching the plate when it is in its said final plate punching position to form one or more press mounting openings in the plate, and (H) bending the plate after it has been punched to form one or more press mounting flanges. The press mounting openings and press mounting flanges are located and configured for mounting of the plate on said particular press with the image on the plate oriented for printing a properly positioned image on the print surface.

Apparatus of this invention for punching and bending a lithographic plate to match a particular press comprises means for conveying lithographic plates one after another to an inspection station, a table for supporting a plate at the inspection station, and means for holding the plate in fixed position relative to the table. A vision system inspects a plate on the table to identify the plate by means of the aforementioned indicia, and to determine the position of the aforementioned at least one registration mark on the plate. A computer system is associated with the vision system for (a) comparing the position of said at least one registration mark to a predetermined reference position, (b) identifying the particular press on which the plate, as identified by said identifying indicia, is to be mounted, and (c) determining whether said at least one registration mark is to be adjusted relative to said reference position to a compensating position to compensate for potential misalignment of the plate image on a print surface when the plate is mounted on said particular press. The apparatus further includes positioning means for moving the table to position the plate at said inspection station in a final plate punching position in which the at least one registration mark on the plate is either in said reference position in the event it is determined there is to be no compensating adjustment, or in said compensating position in the event it is determined there is to be a compensating adjustment. Also included is punch means for punching the plate when it is in its final plate punching position to form one or more press mounting openings in the plate, and bending means for bending the plate after it has been punched to form one or more press mounting flanges.

In another aspect of this invention, apparatus for punching and bending a lithographic plate comprises means for conveying lithographic plates one after another to an inspection station, a table for supporting a plate at said inspection station, and means for holding the plate in fixed position relative to the table. The apparatus also includes an inspection system for (a) inspecting a plate on the vacuum table at the inspection station, (b) determining the extent to which the position of an image on the plate is to be adjusted relative to a predetermined reference position and (c) generating a signal indicative of any such adjustment. Positioning means including stepper motor means is responsive to said signal from the inspection system for moving the table to a final plate punching and bending position in which the image on the plate is in a selected position relative to said reference position. Punch means is provided for punching the plate when it is in its said final plate punching and bending position to form one or more press mounting openings in the plate. Bending means is also provided for bending the plate when the plate is in its final plate punching and bending position and after it has been punched to form one or more mounting flanges for mounting the plate on a press.

Yet another aspect of this invention involves apparatus for bending a lithographic plate having a head ends a tail end and opposite sides. This apparatus comprises means for conveying lithographic plates one after another to a bending station, a table for supporting a plate at said bending station, and means for holding the plate in fixed position relative to the table in a plate bending position. Bending means is provided for bending the plate to form one or more mounting flanges for mounting the plate on a press. The bending means comprises a forward bending unit positioned forward of the table for bending the head end of a plate on the table along a first bend line extending transversely with respect to the plate to form a head end mounting flange, and a rearward bending unit positioned rearward of the table for bending the tail end of a plate on the vacuum table along a second bend line extending transversely with respect to the plate to form a tail end mounting flange. Each bending unit comprises a carriage mounted for movement in end-to-end direction with respect to a plate on the table, a mandrel on the carriage having a bending edge extending transversely with respect to the plate, and a bending bar on the carriage movable relative to the mandrel to bend a respective end of the plate about the bending edge of the mandrel to form a respective mounting flange. The apparatus further comprises stepper motor means for moving the bending units toward and away from one another to adjust the distance between the mandrels to vary the dimension from said first bend to said second bend of a plate.

Another aspect of this invention involves apparatus for bending a lithographic plate having a head end, a tail end and opposite sides. The apparatus comprises means for conveying lithographic plates one after another to a bending station, a table for supporting a plate at said bending station, and means for holding the plate in fixed position relative to the table in a plate bending position. The apparatus further comprises bending means for bending the plate to form one or more mounting flanges for mounting the plate on a press. This bending means comprises a forward bending unit positioned forward of the table for bending the head end of a plate held in fixed position on the table along a first bend line extending transversely with respect to the plate to form a mounting flange bent down at a predetermined angle from the plate at the head end of the plate. The forward bending unit comprises a mandrel having a bending edge extending transversely with respect to the table and a plate held thereon, a bending bar mounted for rotation about an axis extending lengthwise of the bar and parallel to the bending edge of its respective mandrel, and stepper motor means for rotating the bending bar through a predetermined angle to bend the plate about the bending edge of the mandrel to form said mounting flange extending down at said predetermined angle from the plate.

In another aspect of this invention, bending apparatus of the present invention comprises a table for supporting a lithographic plate at an inspection station, a holding mechanism for holding the plate in fixed position relative to the table, and an inspection system for (a) inspecting a plate held on the table at the inspection station, (b) determining the extent to which the plate needs to be adjusted relative to a predetermined reference position, and (c) generating a signal indicative of any such adjustment. A first positioning mechanism is responsive to said signal for automatically moving the table to position a plate on the table for a bending operation. A second positioning mechanism is also provided for positioning a plate on the table for a bending operation. The apparatus further includes a bending mechanism for bending a plate on the table when the plate is positioned for a bending operation. Control means is provided for selectively operating the apparatus in either an inspection mode of operation in which the inspection system and the first positioning mechanism are operable to inspect the plate on the table and then to move the table to position the plate for said bending operation, or in an inspection bypass mode of operation in which the second positioning mechanism is adapted to position the plate for a bending operation without prior inspection of the plate.

Other objects and features will be in part apparent and in part pointed out hereinafter.

BRIEF DESCRIPTION OF THE DRAWINGS

FIG. 1 is a plan of a lithographic plate bearing registration marks and identifying indicia for use in the punching and bending apparatus of this invention;

FIG. 2 is a side elevation of the plate of FIG. 1;

FIG. 3 is a right end elevation of the plate of FIG. 1;

FIG. 5 is a plan of the punching and bending apparatus of the present invention;

FIG. 5A is a diagrammatic view of an inspection system and programmable controller of the apparatus of this invention;

FIG. 7 is an elevational view showing an inspection station conveyor in a raised position;

FIGS. 16A–16E are sequential views illustrating a sequence of steps involved in the operation of the apparatus;

Corresponding parts are designated by corresponding reference characters throughout the several views of the drawings.

DETAILED DESCRIPTION OF THE PREFERRED EMBODIMENT

Figure 4:
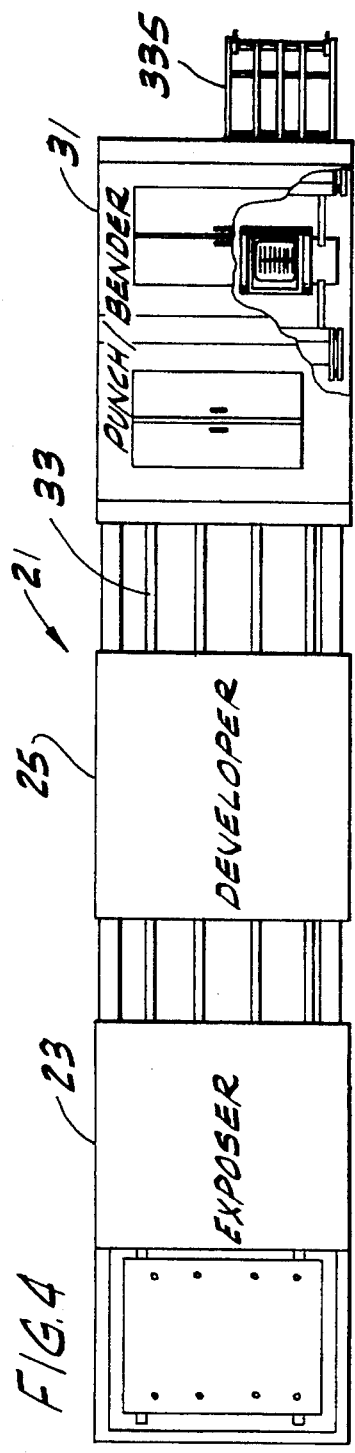
FIG. 4 is a plan view of a plate processing line including the punching and bending apparatus of this invention.

Referring now to the drawings, a lithographic plate P is shown in FIGS. 1–3 as having a front (head) end 1, a rear (tail) end 3, and opposite sides, each designated 5. A front or head end flange 7 is bent sharply downwardly and rearwardly at the front end of the plate along a first bend line B1 extending transversely of the plate, and a rear or tail end flange 9 is bent more gradually downwardly and rearwardly at the rear of the plate along one or two spaced bend lines extending transversely of the plate (two spaced bend lines B2A, B2B being shown in FIG. 1). The front flange has two registration holes 11, 13 in it generally adjacent opposite sides of the plate for use in mounting the plate in fixed position in the exposure process, and a single opening or notch 15 generally centrally located between the ends of the flange for use in mounting the plate on a cylinder of a press (the notch locates the plate in side-to-side direction with respect to the plate cylinder). The rear flange 7 has a similar generally central opening or notch 17 therein used for the same purpose.

Referring now to FIG. 4, apparatus of the present invention for punching and bending a lithographic plate is designated in its entirety by the reference numeral 21. Typically, lithographic plates are first punched by conventional punching apparatus (not shown) to form the appropriate registration holes 11, 13 prior to exposure of the plate. The plates are then transferred to exposing apparatus 23 where each plate is precisely positioned relative to an overlying film (by means of registration pins extending through aligned registration holes in the plate and the film). The plate is then exposed through the film which has an image I thereon, the process being such that the image is transferred to the plate. As disclosed in co-assigned U.S. Pat. No. 5,193,690, this image includes at least one registration mark (e.g., registration marks R1 and R2 in FIG. 1) on or adjacent the front and rear flanges 7, 9 (which are formed after the exposure process). These marks are indicative of the position of the portion of the image to be printed relative to the plate. The plate also has indicia thereon in the form of a folio F, bar code or other mark or means identifying the plate (the folio or bar code may, for example, identify the particular page of the newspaper to be printed by the plate). As will appear later in this description, the registration marks R1, R2 and the folio F (or bar code) are used in the present invention.

After the plate is exposed, it is chemically treated by developing apparatus generally indicated at 25 in FIG. 4, and then conveyed to the punching and bending apparatus 31 of the present invention by suitable conveyors 33. This apparatus 31 then functions to punch the plate P to form the press mounting openings (notches 15, 17), and then to bend it to form the front and rear flanges 7, 9. In accordance with one aspect of this invention, this can be done in such a way that the finished plate will "match" the particular press on which it is to be mounted, that is, the plate can be punched and bent in a way which will compensate for any print registration errors associated with that particular press, so that when the plate is mounted on the press, any such errors are eliminated.

As illustrated in FIGS. 5 and 5A, apparatus of this invention comprises a frame or base 41, conveyor means 43 on the base for accepting flat (unbent) plates delivered by conveyor 33 and conveying the plates one after another to an inspection station 45, a table 47 at the inspection station for supporting a plate at the inspection station in a preliminary position, and an inspection system, generally designated 51, for inspecting each plate on the table 47 at the inspection station and determining whether an adjustment of the position of the plate is necessary before it is punched and bent so that the plate "matches" the press on which it is to be mounted. The apparatus also includes first positioning means generally indicated at 53 for moving the table 47 to position the plate at the inspection station in a final plate punching and bending position in response to input from the inspection system 51. A first bending unit 55 is positioned forward of the table for bending the front end of a plate on the table to form the front flange 7, and a second bending unit 57 is positioned rearward of the table for bending the rear end of the plate to form the rear flange 9 (these two bending units 55, 57 combine to constitute bending means). Punch means comprising a pair of punch mechanisms, each generally designated 61, are provided for punching the plate to form the notches 15, 17. The punching and bending operations take place while the plate remains in the same position (i.e., its final plate punching and bending position).

Conveyor means 43 is similar in certain respects to the entry conveyor means 33 described in co-assigned U.S. Pat.

Figure 6:
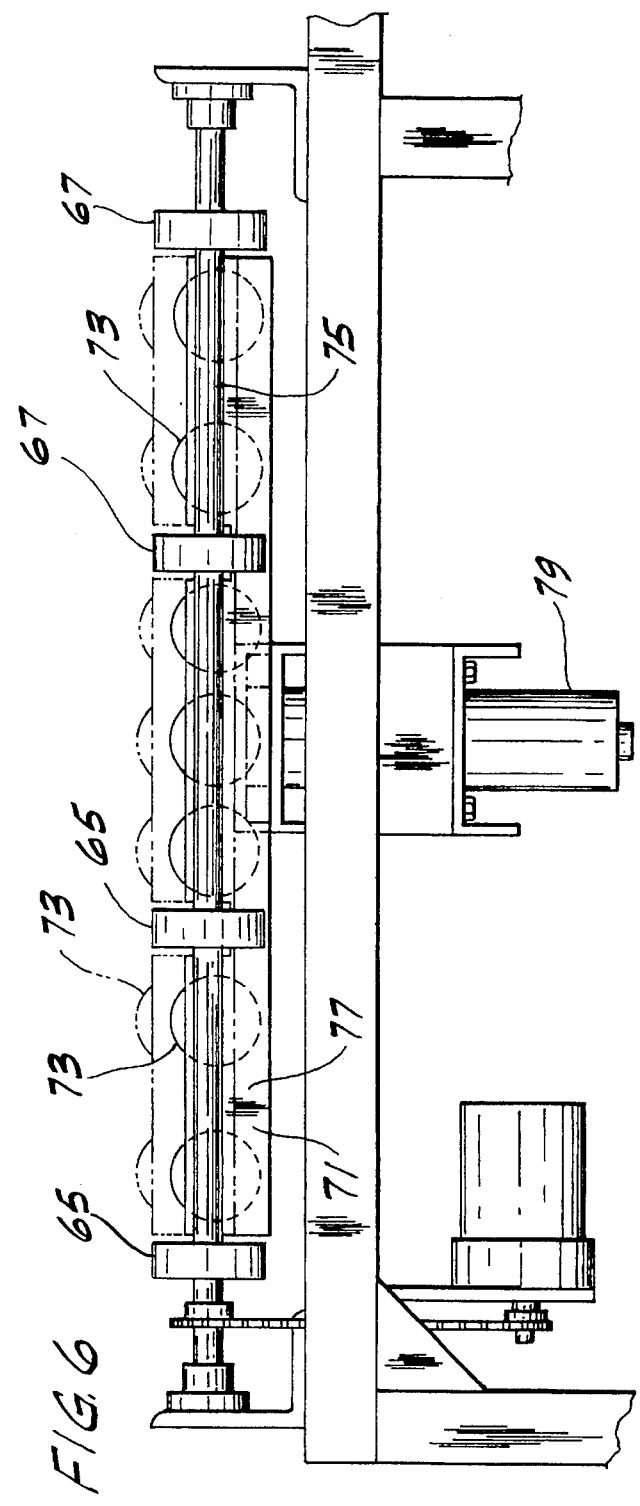
FIG. 6 is a vertical section on line 6—6 of FIG. 5.

No. 5,193,690, which is incorporated herein by reference. Conveyor means 43 comprises two pairs of endless entry belts, the first pair being indicated at 65 in FIG. 5 and the second pair being designated 67° Each pair of entry belts is adapted for carrying a single-wide plate from left to right as viewed in FIG. 5, with the head (front) end of the plate leading as it moves forward on the belt. Conveyor means 43 also includes a roller conveyor 71 comprising a series of rollers 73 mounted on parallel shafts 75 the ends of which are journaled in a conveyor frame 77. This frame is vertically movable in guides 78 affixed to the base 41 by means of a pneumatic or hydraulic cylinder 79 between a lowered position in which the tops of the rollers 73 are disposed below the upper reaches of the entry belts 65, 67 (see FIG. 6), and a raised position (shown in phantom in FIG. 6) in which the tops of the rollers are disposed above the belts for conveying a plate (or plates) thereon sideways in a direction generally at right angles to the direction of the entry belts (i.e., from top to bottom as viewed in FIG. 5). Cylinder 79 is under the control of a programmable logic controller PLC to maintain the roller conveyor in its normally lowered position. A stop plate 81 is mounted adjacent one side of the first pair of entry belts 65 for engagement by a side edge of a plate conveyed sideways by the roller conveyor 71 thereby to position the plate for conveyance to the inspection station 45. The rollers are conjointly rotated by means similar to that described in U.S. Pat. No. 5,193,690. A restraining bar 83 is mounted on the conveyor frame 77 in a position extending generally parallel to the roller shafts 75 and midway between the two pairs of endless belts. This restraining bar 83 is movable by cylinders 85 between a lowered, non-restraining position and a raised, restraining position in which the bar is disposed above the tops of the belts and rollers for engagement by a plate on the second pair of entry belts 67. The function of this bar 83 will become apparent.

A fixed stop 91 is mounted on the base 41 adjacent the downstream end of the entry conveyor belts 67 for stopping a plate as it is conveyed forward by the belts (see FIG. 5). This stop 91 is always in a position for engagement by the leading edge of a plate advancing on belts 67. A pair of stop pins 93A, 93B are provided adjacent the downstream end of the entry belts 65 for stopping a plate fed forward by these belts. Stop pins 93A, 93B are movable between raised and lowered positions by solenoids under the control of the controller PLC. Photosensors 97, 99 mounted below the two conveyors 65, 67 detect the presence of plates stopped on respective conveyors. It will be understood that when the roller conveyor 71 and stop pins 93A, 93B are in their stated lowered positions, the first pair of entry belts 65 is adapted to convey a plate thereon forward toward the inspection station 45.

Conveyor means 43 also includes an inspection station conveyor 101 comprising a pair of endless belts 103 at the inspection station for accepting a plate conveyed forward by the first pair of entry belts 65. The two belts at the inspection station are trained around pulleys on shafts 105 journaled in a conveyor frame 107. These shafts 105 are rotated by a motor to drive the belts. The conveyor frame 107 carrying the belts is movable from a raised generally horizontal position (FIG. 7) in which the upper reaches of the belts are disposed for accepting a plate and conveying it to the inspection station, to a generally horizontal lowered position (FIG. 8) for depositing the plate on the upper surface of a vacuum table 115 of the aforementioned positioning means 53, and then to a raised and tilted position (FIG. 9) for conveying a plate from the inspection station after the punching and bending process is complete. The conveyor frame 107 is moved by a pair of pneumatic or hydraulic cylinders 117 adjacent the front ends of the conveyor belts 103 and a pair of cylinders 119 adjacent the rear ends of the belts. These cylinders are under the control of the programmable controller PLC. As illustrated in FIG. 7, the front cylinders 117 are mounted on a bar 121 which is hinged at 123 to the base 41 of the machine for pivotal movement of the cylinders (and the entire conveyor frame 107) about a generally horizontal axis 125 extending transversely with respect to the vacuum table 115. The rear cylinders 119 are mounted on a similar bar 127 extending generally parallel to bar 121. The front and rear cylinders 117, 119 are operable in unison to raise and lower the conveyor frame 107 while maintaining the conveyor belts 103 generally horizontal.

Figure 8:
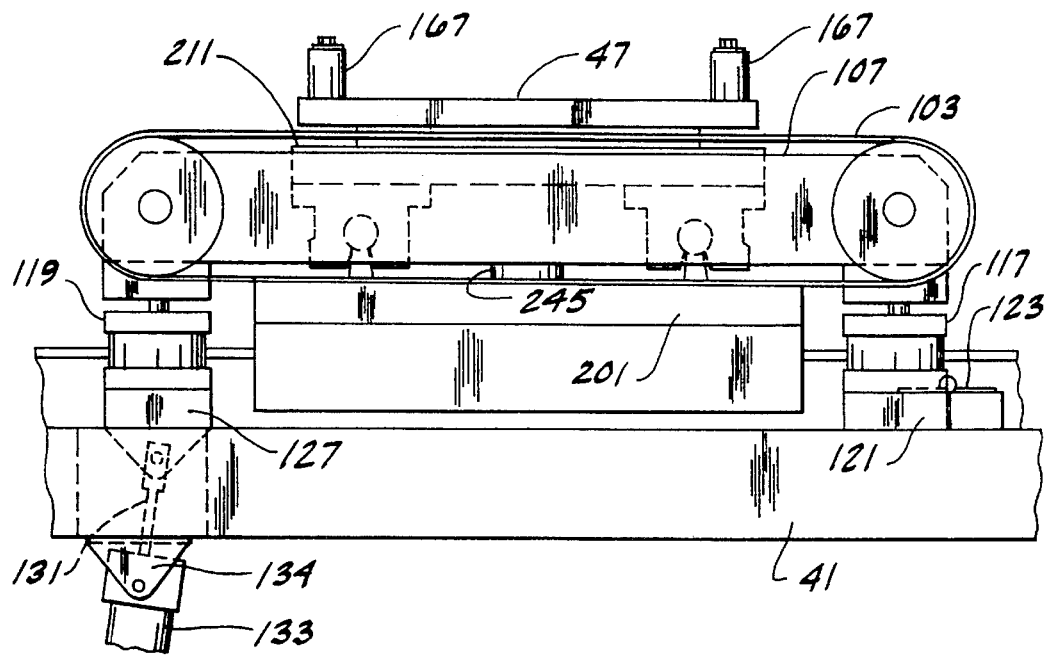
FIG. 8 is a view similar to FIG. 7 showing the inspection station conveyor in a lowered position.
Figure 9:
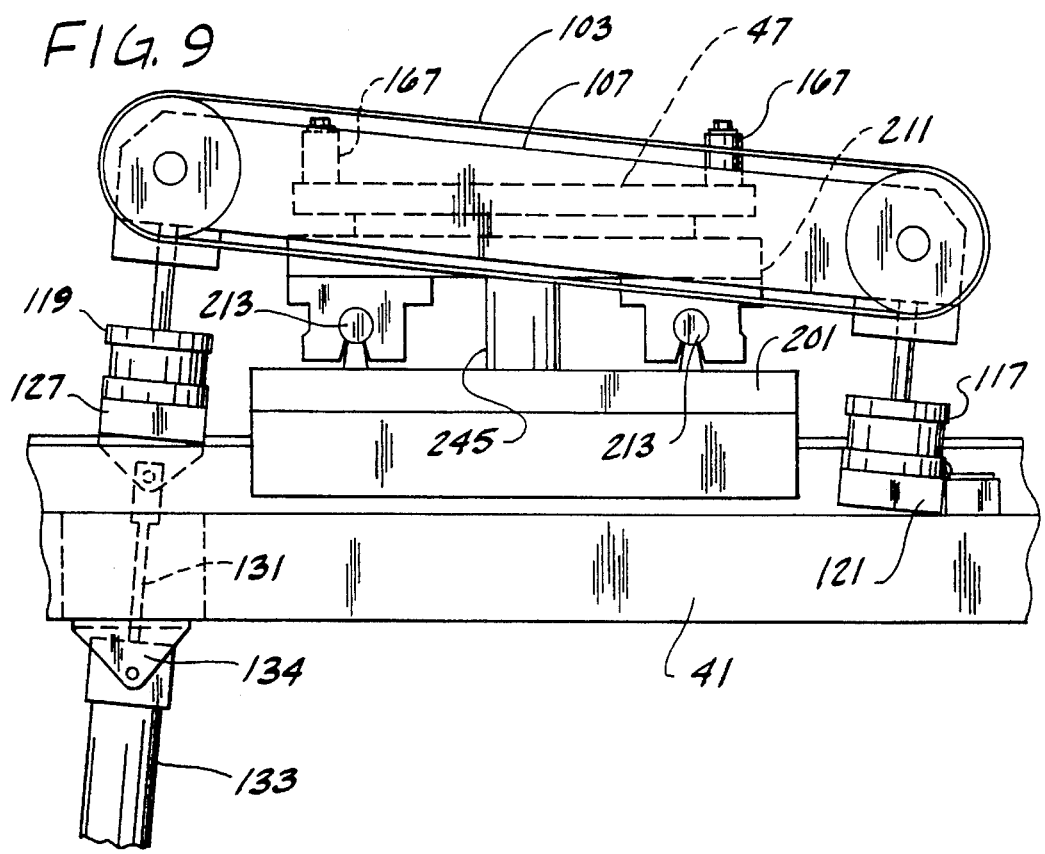
FIG. 9 is a view similar to FIG. 7 showing the inspection station conveyor in a raised and tilted position.

The rear bar 127 is connected via a universal joint to the piston rod 131 of a cylinder 133 pivoted at 134 on the base, the arrangement being such that extension of the piston 131 lifts the bar 127 and the two rear cylinders 119 thereon to pivot the conveyor frame 107 on axis 125 and thereby tilt the rearward end of the conveyor to the position shown in FIG. 8 in which the conveyor belts 103 slope down toward the front of the conveyor. Cylinder 133 is also under the control of the controller PLC.

A pair of solenoid-operated stops 141 are mounted on the forward (right as viewed in FIG. 5) bending unit 55. These stops 141, which are under the control of the programmable controller PLC, are movable between a stopping position (see FIG. 7) in which they extend up for engagement by the forward leading end of a plate as it is conveyed forward by the inspection station conveyor 101 to stop the plate at the inspection station 45, and a non-stopping position in which they are retracted to permit a plate which has been punched and bent to be conveyed away from the inspection station. A photoelectric sensor 145 detects the presence of a plate at the inspection station.

A pusher bar assembly, generally designated 151, is provided at one side of the vacuum table 47 (the upper side as viewed in FIG. 5) for pushing a plate deposited on the vacuum table sideways against a pair of lateral positioning stops 153 at the opposite side of the table to position the plate in a preliminary position prior to inspection and positioning of the plate by the inspection system 51. The pusher bar assembly comprises a pusher bar 155 mounted on a bracket 157 slidable on a pair of guide rods 161 between a retracted position (FIG. 5) and an extended position for pushing a plate on the vacuum table sideways. The pusher bar is moved between its retracted and extended positions by a cylinder 165 having a reed switch (not shown) associated therewith which is actuated when the pusher bar is moved to its extended position. A pair of rollers, each designated 167, projecting upwardly from the pusher bar 155 are engageable with a plate on the vacuum table for pushing it sideways as the pusher bar moves from its retracted to its extended positions. The rollers are of low-friction, relatively soft material (e.g., neoprene) so as not to damage a plate as it is pushed sideways. The rollers 167 also turn freely on vertical axes to prevent binding of the plate during the positioning process.

The lateral positioning stops 153 are movable by means of pneumatic cylinders 171 between a lowered position and a raised position in which they are engageable by a plate pushed sideways on the vacuum table by the pusher bar assembly 151.

Figure 10:
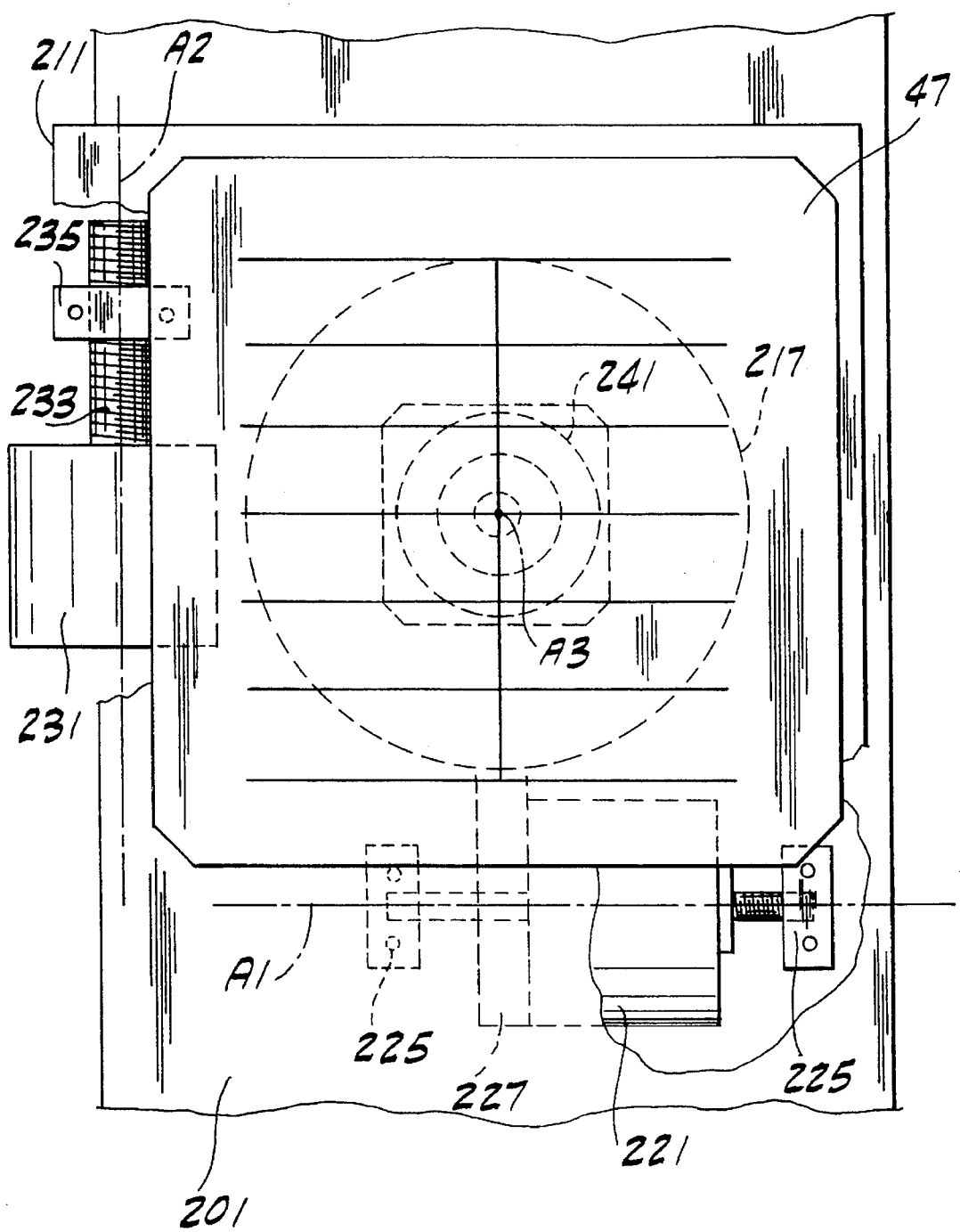
FIG. 10 is a plan view of a vacuum table at the inspection station.

The vacuum table 47 is rectangular in shape, having a length substantially less than that of a plate so that the plate, when positioned on the table, extends beyond both ends of the table, and a width somewhat less than the width of the plate. The table has grooves 179 in its upper surface which communicate with a source of vacuum 181 (FIG. 10) which constitutes means for holding the plate in fixed position on the table. It will be understood that other holding means may also be suitable. The vacuum is drawn on the plate after the plate has been pushed sideways by the pusher bar assembly 151 against the lateral positioning stops 153, the plate then being in what may be referred to as a preliminary position prior to inspection.

The inspection system 51 is similar to that described in U.S. Pat. No. 5,193,690 (which specifies a system of the type commercially available from Harland Simon Scanning Systems, Ltd., Smith House, Bond Ave., Milton Keynes, MKI 1UH, England), but it is modified in certain important respects. The system comprises a vision system 185 which includes two cameras 187, 189 suitably mounted on the forward and rear bending units 55, 57 generally diagonally with respect to one another for optically inspecting the registration marks R1, R2 on a plate held in the stated preliminary position at the inspection station 45, and an optical character reader OCR suitably mounted for reading the folio F or bar code on the plate. The OCR may, for example, be of the type available from Logitech Corporation of Fremont, Calif., under the trademark "Logiscan". The vision system 185 is associated with a computer 191 (e.g., an IBM personal computer) which has a central processing unit 193, a memory 195, and which runs on software operable for comparing the position of the registration marks R1, R2 to a master reference position in memory indicative of the image being "square" on the plate. In accordance with this invention, the computer is also operable for determining whether the image I on the plate (including registration marks R1, R2) is to be adjusted relative to the stated master reference position to a compensating position to compensate for potential misalignment of the image on a print surface (e.g., newspaper stock) when the plate is mounted on a particular press. This determination is made on the basis of information input into the computer (as by a keyboard 197). By way of example, such information may correlate various plates, as identified by their respective folios F or bar codes, and the presses on which the plates are to be mounted, and may also correlate various presses and compensating data relating to such presses. For example, if the image I printed by a particular press in operation is an observed distance out of registration in one direction (up, down, right or left), the compensating data for that press could be the same distance in the opposite direction to compensate for such misregistration. The software of the inspection system 51 is modified to take this compensating data into account. Based on the aforementioned comparison of the position of the registration marks R1, R2 and the master reference position, and by taking the compensating data into account to make any compensating adjustments which are necessary, the computer 191 can send appropriate signals to positioning means 53 to move a plate on the vacuum table 47 from its stated preliminary position to its final plate punching and bending position.

As shown in FIG. 5A, the computer 191 is connected to the programmable controller PLC and receives a trigger signal from the PLC to initiate the inspection process after the plate is in its stated preliminary position. This trigger signal is generated, for example, after a predetermined time delay from actuation of the reed switch associated with the pusher bar 155, or after actuation of the vacuum to draw the plate down on the table.

The positioning system 53 for positioning the plate in its final plate punching and bending position includes a first (lower) carriage 201 slidable on a pair of parallel tracks 203 extending lengthwise of the base 41 on opposite sides of the vacuum table 47 for movement of the carriage relative to the base in a generally horizontal plane along a first axis A1 generally parallel to the side edges of a plate on the vacuum table. The tracks 203 may, for example, be in the form of slide rails affixed to the base. The positioning system also includes a second (upper) carriage 211 slidably mounted on parallel guide rods 213 on the lower carriage 201 for movement relative thereto in a generally horizontal plane along a second axis A2 generally perpendicular to the aforesaid first axis A1 and generally parallel to the end edges of a plate on the table. The vacuum table 47 is mounted by means of a thrust bearing assembly 217 on the upper carriage 211 for rotation about a vertical axis A3.

Figure 11:
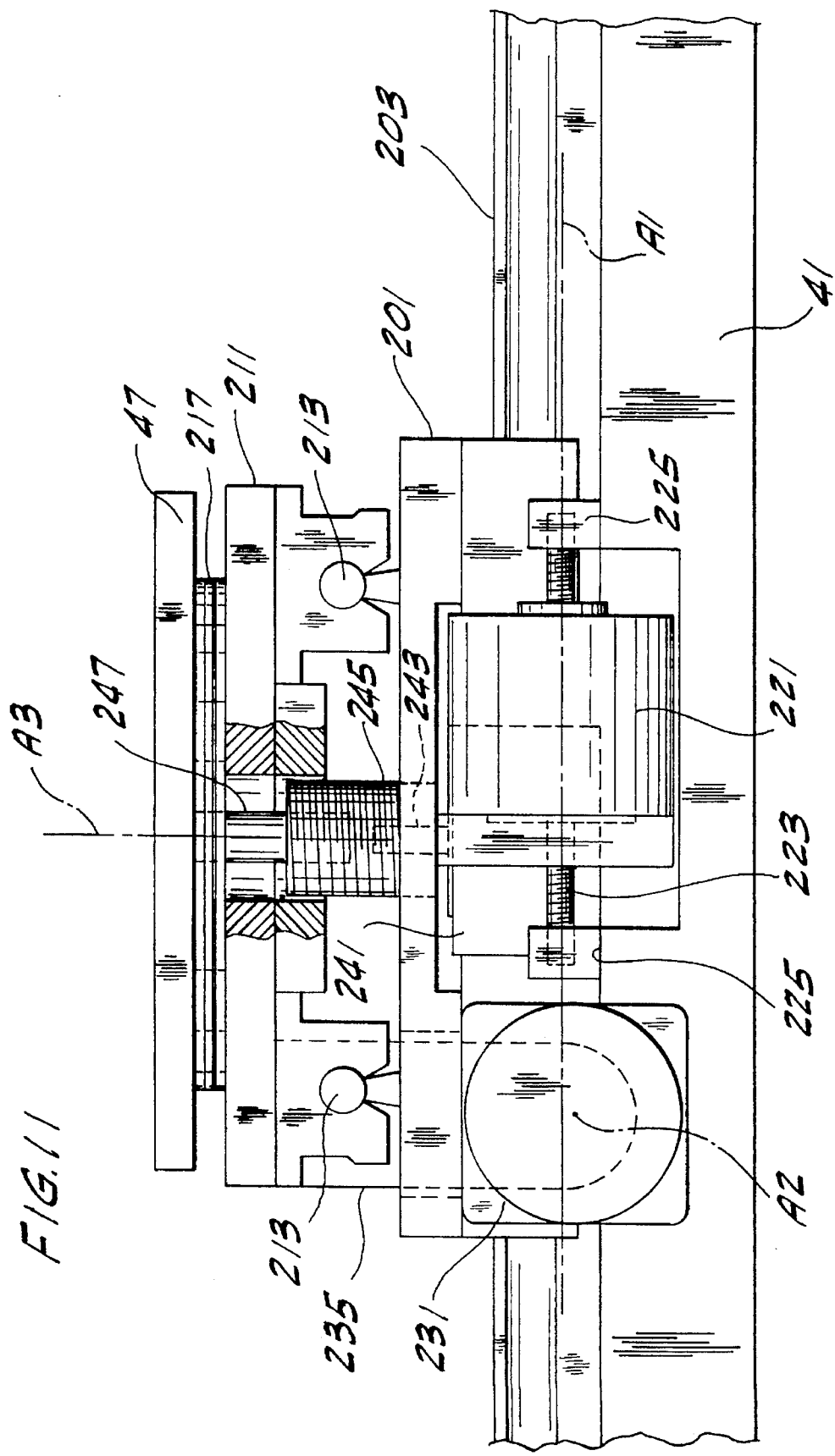
FIG. 11 is a side elevation of means for positioning the vacuum table in its final plate punching and bending position.

As shown in FIG. 11, the lower carriage 201 is movable along rails 203 by a first stepper motor 221 having a rotatable inner part in threaded engagement with a screw shaft 223, the ends of which are mounted in blocks 225 affixed to the base 41, and a non-rotatable outer part 227 affixed to the lower carriage 211. The arrangement is such that operation of the stepper motor 221 effects movement of the motor and the lower carriage along the screw shaft 223 and rails 203.

As best illustrated in FIG. 5, the guide rods 161 of the pusher bar assembly 151 are affixed to the lower carriage 201 so that the entire assembly moves with the carriage. The lateral positioning stops 153 are also mounted on the lower carriage by means of a bracket 229 having a pin-and-slot connection 230 with the lower carriage to permit lateral adjustment of the stops to accommodate plates of different widths.

The upper carriage 211 is moved along guide rods 213 by a second stepper motor 231 affixed to the lower carriage 201 and having a rotatable inner part in threaded engagement with a screw shaft 233 (FIG. 10) connected to a block 235 attached to the upper carriage. Rotation of the stepper motor 231 in one direction functions to move the screw shaft 233 and the upper carriage 211 linearly in one direction along the axis A2 of the screw shaft, while rotation in the reverse direction effects linear movement of the screw shaft and the upper carriage in the opposite direction along the screw shaft.

The positioning system 53 also includes a third stepper motor 241 mounted on the base 41 with its output shaft 243 extending up for connection by means of a flexible coupling 245 to a shaft 247 extending down from the vacuum table 47. Operation of this stepper motor 241 effects rotation of the vacuum table about vertical axis A3. The coupling 245 is sufficiently flexible to accommodate the relatively small movements of the table 47 in a horizontal plane along axes A1 and A2 on account of the movement of the carriages 201, 211. It will be noted in this regard that the magnitude of movement of the plate from its preliminary position to its final plate punching and bending position is small.

Figure 12:
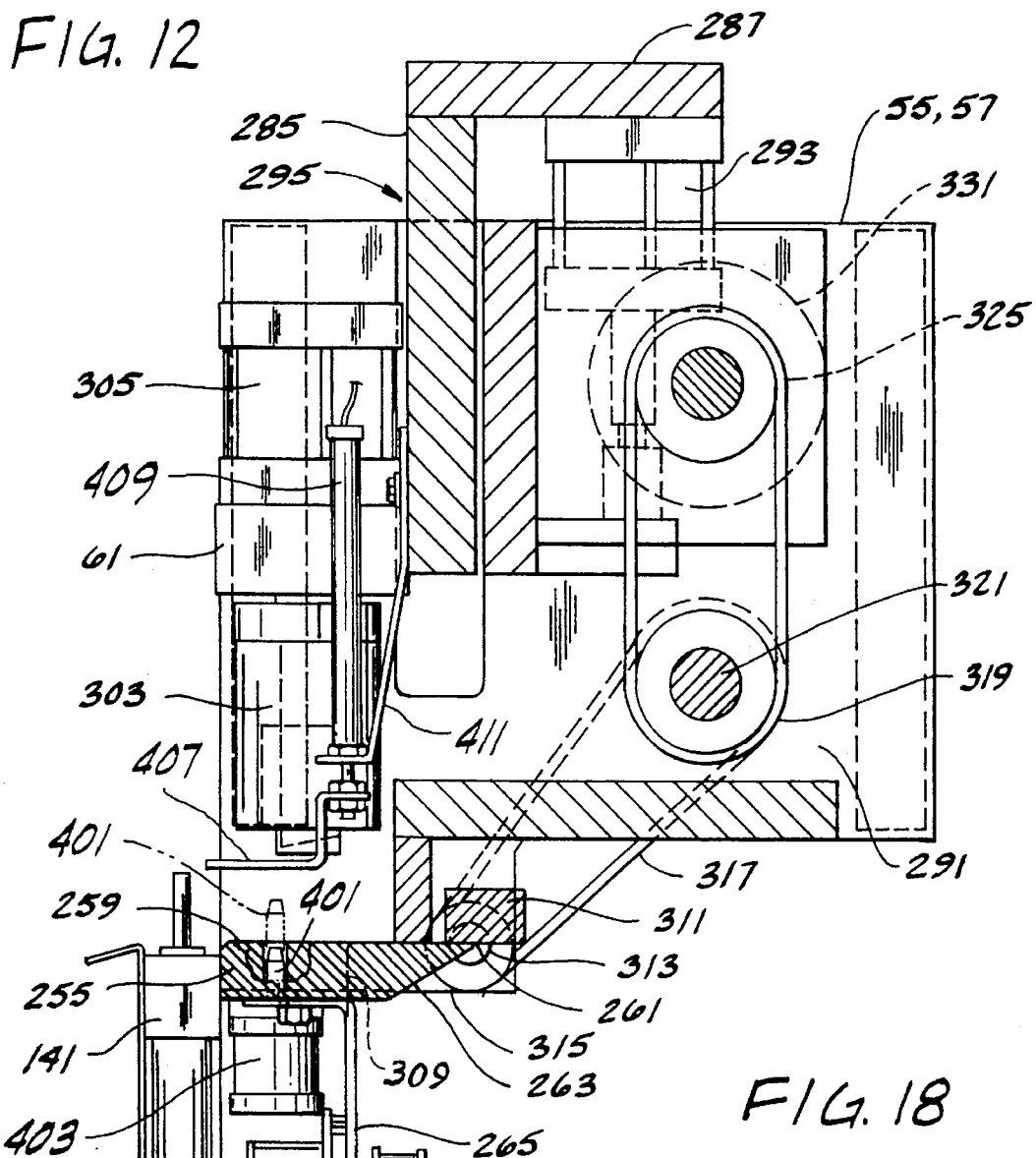
FIG. 12 is a vertical section taken on line 12—12 of FIG. 5 showing a bending unit and punch of the apparatus.

As mentioned, the bending units 55, 57 are mounted forward and rearward of the vacuum table 47. Each unit comprises a carriage 251 comprising a pair of sliders 253 slidable on the rails 203 extending lengthwise of the base 41 (i.e., parallel to axis A1) on opposite sides of the vacuum table. As shown in FIG. 12, each unit also includes a bending mandrel 255 in the form of a horizontal bar having its ends fastened to spacer blocks 257 attached to the sliders 253, so that the mandrel extends transversely with respect to a plate at the inspection station (i.e., parallel to axis A2). Each bending mandrel 255 has a flat upper surface 259, a precision, small-radius bending edge 261 about which a plate is bent, and a lower surface 263 which angles downwardly away from the bending edge at an angle greater than the angle at which the respective plate mounting flange is to be bent. A bracket 265 extending down from each mandrel 255 is connected at its lower end to a ball nut 267 mounted on a horizontal screw shaft 271 affixed to the base 41 and extending generally parallel to the slide rails 203. The ball nut 267 has an outer part 267A to which the bracket is affixed, and an inner part 267B rotatable relative to the outer part and threadably engageable with the screw shaft 271. The inner part is rotatable by means of a timing belt 275 driven by a stepper motor 277 mounted on the base, the arrangement being such that operation of the stepper motor 277 effects rotation of the inner part of the ball nut to move the nut and its respective bending mandrel 255 along the screw shaft 271 (each mandrel is moved by a separate stepper motor 277).

Figure 14:
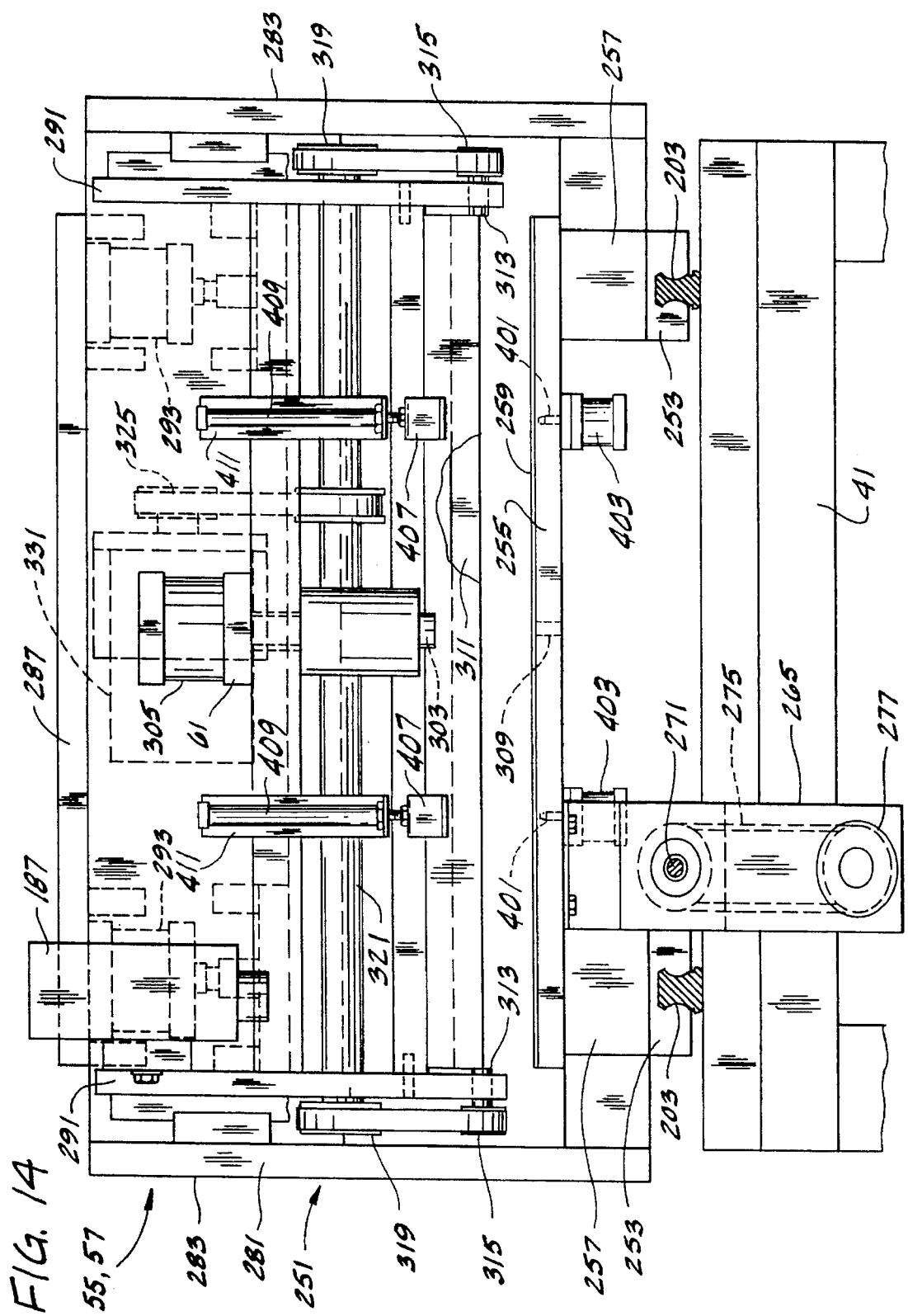
FIG. 14 is a sectional view taken on line 14—14 of FIG. 5 showing, among other things, a bending unit with a bending mandrel in a raised position.
Figure 15:
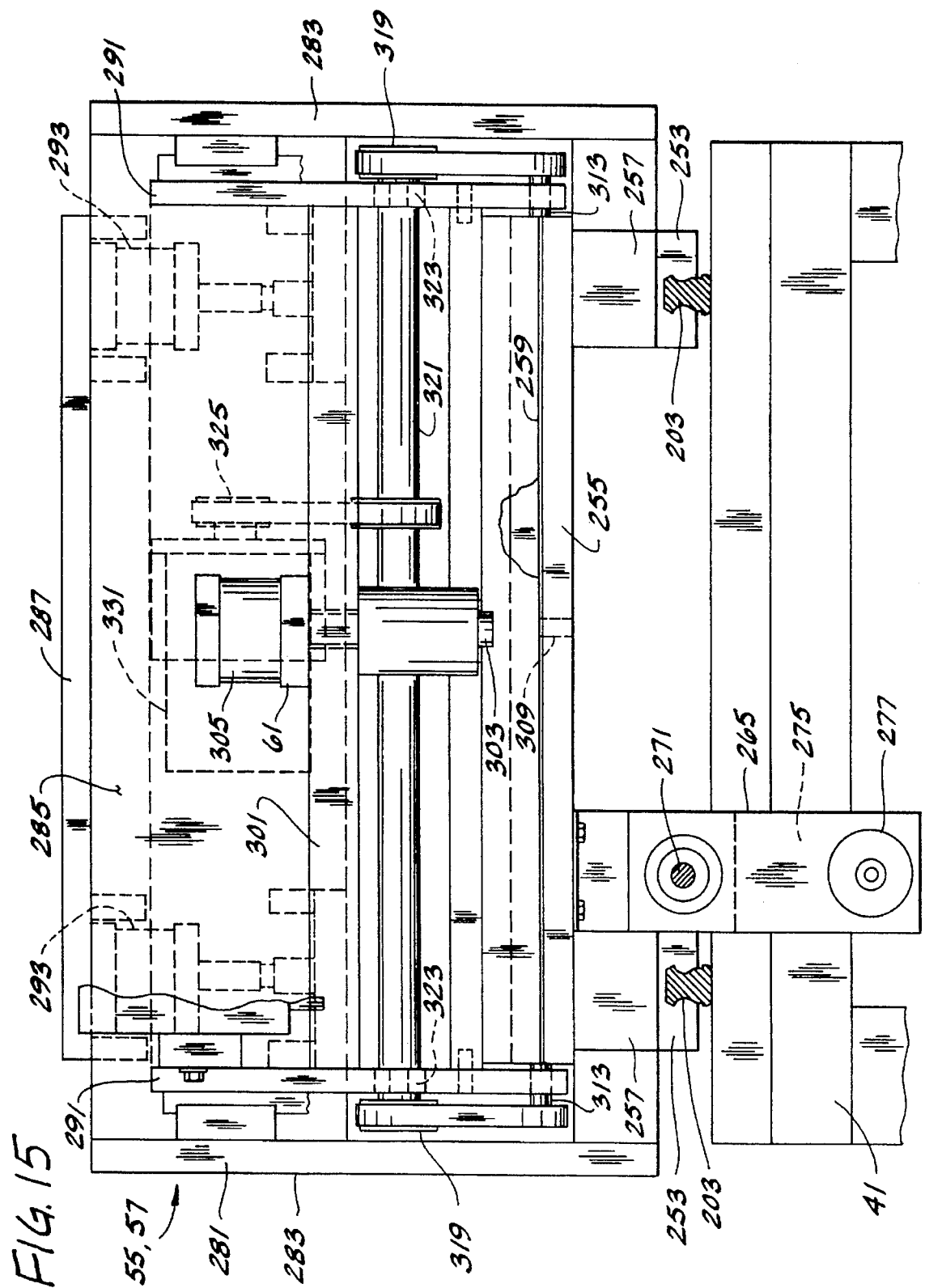
FIG. 15 is a view similar to FIG. 14 showing the bending mandrel in a lowered position for bending a plate held on the vacuum table.

The carriage 251 of each bending unit 55, 57 includes a bridge-like main frame 281 comprising a pair of parallel side plates, each designated 283, extending up from the sliders 253 adjacent opposite ends of a respective mandrel, a cross plate 285 connecting the two side plates, and a top plate 287 bridging the two side plates. A subframe 291 is slidably mounted on the main frame 281 for up and down movement relative to the main frame, upward movement being effected by retraction of the pistons of two cylinders 293 affixed to the top plate 287 of the main frame, and downward movement being effected by extension of the pistons of the cylinders 293. Pin and slot connections 295 between the main frame 281 and the subframe 291 permit such movement. FIG. 14 shows the subframe 291 in a raised position and FIG. 15 shows the subframe in a lowered position.

A punch mechanism 61 is mounted on a cross beam 301 of the subframe 291 generally midway between the side plates 283 of the main frame 281. The punch mechanism includes a punch tool 303, and a punch cylinder 305 for moving the tool through a punching stroke. The bending mandrel 255 has an opening 309 therein for receiving the cutting tool 303 during its downstroke, and for allowing scrap punched from the plate to drop into a suitable receptacle (not shown) below the bending mandrel. The punch mechanism 61 is a standard mechanism well known to those skilled in this field.

As shown best in FIG. 5, the two cameras 187, 189 of the vision system 185 are mounted on the subframes 291 of the forward and rearward carriages 251 at locations convenient for inspection of a plate in its stated preliminary position on the vacuum table. The cameras may be mounted at other suitable locations. The optical character reader OCR is also mounted at a location suitable for reading the folio F on a plate.

Figure 13:
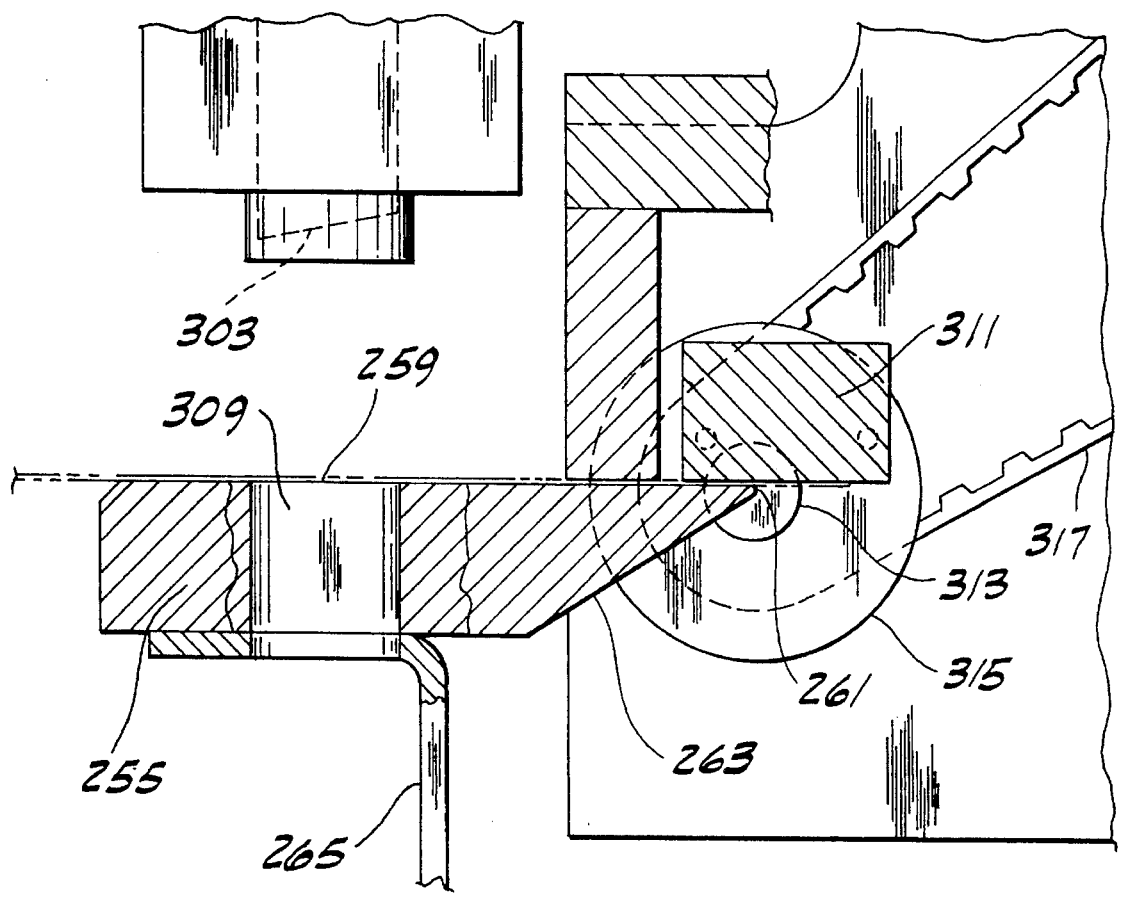
FIG. 13 is an enlarged portion of FIG. 13 showing additional details.

Referring now to FIG. 13, the bending mechanism of each bending unit 55, 57 also includes (in addition to the bending mandrel 255) a horizontal bending bar 311 extending generally parallel to the mandrel adjacent the bending edge 261 of the mandrel. As illustrated in FIG. 13, the bar is of metal bar stock and rectangular in cross section. A pair of pinions 313 extending from and rigidly affixed (e.g., welded) to opposite ends of the bar 311 are journaled in suitable bearings on the subframe 291 to mount the bending bar for rotation about a generally horizontal axis parallel and immediately adjacent to or coincident with the bending edge 261 of the mandrel. The two pinions 313 carry pulleys 315 which are connected by a pair of timing belts 317 to pulleys 319 on a horizontal drive shaft 321 rotatably mounted in bearing blocks 323 on the subframe and having a driving belt connection 325 to a stepper motor 331 also mounted on the subframe. The arrangement is such that operation of the stepper motor 331 in one direction effects rotation of the bending bar to bend a respective end of a plate on the vacuum table 47 about the edge 261 of the respective bending mandrel 255, and operation of the stepper motor in the opposite direction effects rotation of the bending bar back to its home position (FIG. 13). It will be observed that since the bending bar 311, drive shaft 321 and stepper motor 331 are carried by the subframe 291, extension and retraction of the subframe cylinders 293 effects conjoint upward and downward movement of these parts. The design is such that when the subframe is in its lowered position (FIG. 13) the bending bar 311 and punch mechanism 61 are properly located to effect their respective punching and bending operations. When the subframe is raised, as shown in FIG. 14, the bending bar is raised a distance sufficient to permit discharge of the plate from the inspection station 45 by conveyor 101 onto a suitable outfeed conveyor 335 (FIG. 4).

The stepper motors 221, 231, 241 associated with the positioning system 53, and the stepper motors 277, 331 associated with the bending units 55, 57, may be of the type commercially available under the trademark "Slosyn" from Superior Electric Company of Bristol, Conn. As shown in FIG. 5A, the stepper motors are under the control of the computer 191 which is equipped with a suitable circuit board and software package 337 for controlling the stepper motors, such as a motion control system commercially available from Motion Engineering, Inc. of Santa Barbara, Calif. under the trade designation "PC-DSP Series Motion Controller Board".

In operation, conveyor 33 feeds a series of pairs of plates to the punching and bending apparatus 31 of this invention, the two plates of each pair being disposed side-by-side as they enter the apparatus and are conveyed forward (left to right as viewed in FIG. 5) by the entry belt conveyors 65, 67 until they are stopped by fixed stop 91 and entry stops pins 93A, 93B, respectively. Assume now that there are two plates P1, P2 on the entry conveyor belts (plate P1 on conveyor 65 and plate P2 on conveyor 67), and that a plate which has been punched and bent has just exited the inspection station 45, as sensed by the photosensor 145. After a delay of predetermined duration (e.g., one second) following a signal from photosensor, solenoids are actuated to raise the exit stops 141 to their stopping positions, and cylinders 171 are actuated to raise the lateral positioning stops 153. Solenoids are also activated to lower the entry stops 93A, 93B associated with the first entry conveyor 65 to permit plate P1 to be conveyed forward onto the inspection station conveyor 101, which conveys the plate to the inspection station 45 where it is stopped by the exit stops 141 (see FIG. 16A). The entry stops 93A, 93B return to their raised positions when the photosensor 145 at the inspection station senses arrival of the plate P1. After a delay of predetermined duration (e.g., three seconds) following conveyance of plate P1 from the first entry conveyor 67 (as detected by photosensor 99), cylinders 85 are actuated to lower the restraining bar 83, and cylinder 79 is actuated to raise the roller conveyor 71 to move plate P2 sideways against the fixed stop 91. After a time delay (e.g., two seconds), the roller conveyor drops back down to deposit the plate P2 on the second belt conveyor 67 for conveyance forward against the raised entry stops 93A, 93B.

Upon arrival of a plate at the inspection station 45, as detected by photosensor 145, cylinders 117 and 119 are actuated to lower the inspection station conveyor frame 107 to deposit the plate on the vacuum table 47 and on the bending mandrels 255, the upper surfaces 259 of which are coplanar with the top surface of the vacuum table. When the conveyor 101 arrives at its lowered position, the pusher bar cylinder 165 is actuated to move the pusher bar 155 from its retracted to its extended position to bring the rollers 167 into engagement with the side edge of the plate P1 and to push it sideways on the table against the lateral positioning stops 153 (which are adjusted according to the width of the plate). After a short-delay following activation of the aforementioned reed switch indicating that the pusher bar is in its extended position, the vacuum is drawn to hold the plate on the table (see FIG. 16B). The PLC then signals the appropriate cylinders to lower the exit stops 141 and the lateral positioning stops 153, and to retract the pusher bar 155. At the same time, a trigger signal is sent by the PLC to the inspection system 51 to initiate the inspection process.

As discussed above, the vision system 185 is operable to identify the plate P1 on the vacuum table 47. This is accomplished by means of the OCR reading the identifying indicia (e.g., the folio F, bar code or other mark) on the plate. The vision system is further operable to determine the position of the registration marks R1, R2 on the plate. The computer 191 compares the position of the registration marks (as detected by the two cameras 187, 189) to a predetermined master reference position stored in computer memory 195. The computer also identifies the particular press on which the plate, as identified by the aforementioned folio F, is to be mounted, and determines whether the position of the registration marks R1, R2 (and image I) on the plate are to be adjusted relative to the master reference position to a compensating position to compensate for potential misalignment of the plate image on the print surface when the plate is mounted on the particular press for which it is destined. In making this determination, the computer uses information which has been previously input by means of keyboard 197. This information may, for example, correlate the identifying indicia on each plate with the press on which the plate is to be mounted (e.g., a plate with a certain folio is to be mounted on press No. 23). The information may also correlate each press with certain information pertaining to whether that particular press is printing in registration or out of registration. If, for example, press No. 23 is printing images which are 0.01" out of registration to the left, this information is input into the computer. If the inspection system then identifies a plate at the inspection station as being destined for press No. 23, the computer will use this information to determine that a compensating adjustment of 0.01" to the right is needed to compensate for the press misregistration.

Once the computer 191 has determined what, if any, adjustment of the plate image I is needed, it sends a signal to the appropriate stepper motor or motors 221, 231, 241 to move the vacuum table 47 (and plate thereon) along axes A1 and/or A2, and/or to rotate the table on axis A3, to position the plate in the stated final plate punching and bending position. If no compensating adjustment is needed, this position will usually be one in which the registration marks R1, R2 on the plate are in the master reference position indicating that the image on the plate is "square" relative to the plate. If a compensating adjustment is needed, then the final plate punching and bending position will correspond to the aforementioned compensating position to take into account the a misregistration or misalignment observed with respect to the particular press on which the plate is to be mounted.

Figure 17A:
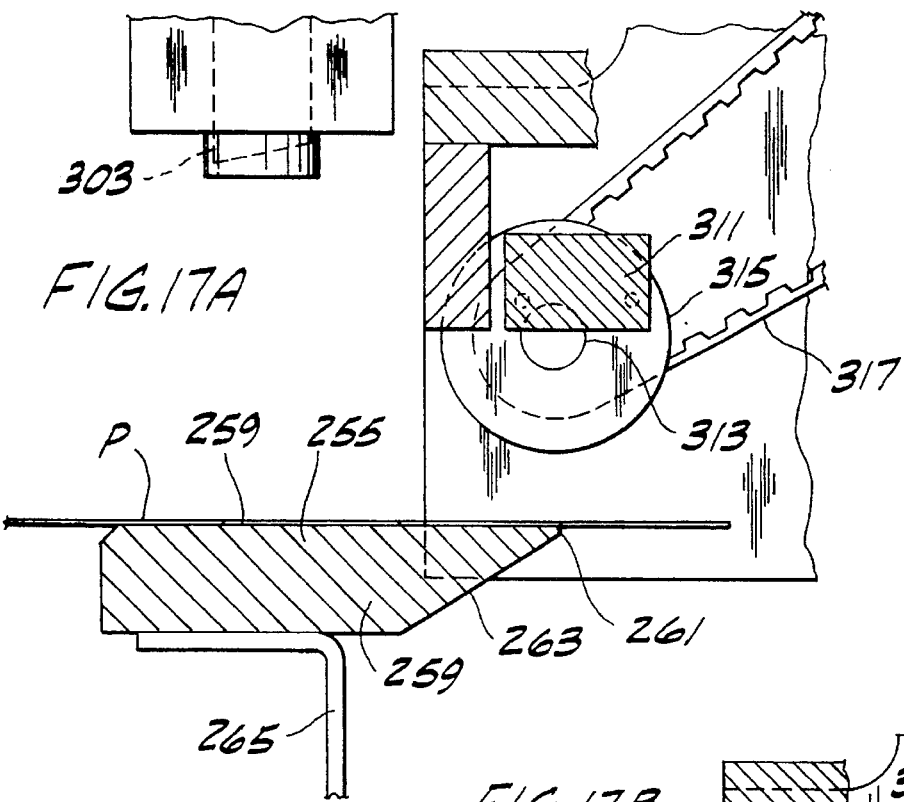
FIGS. 17A–17C are sequential views illustrating operation of a bending bar and mandrel of the apparatus of this invention.
Figure 17B:
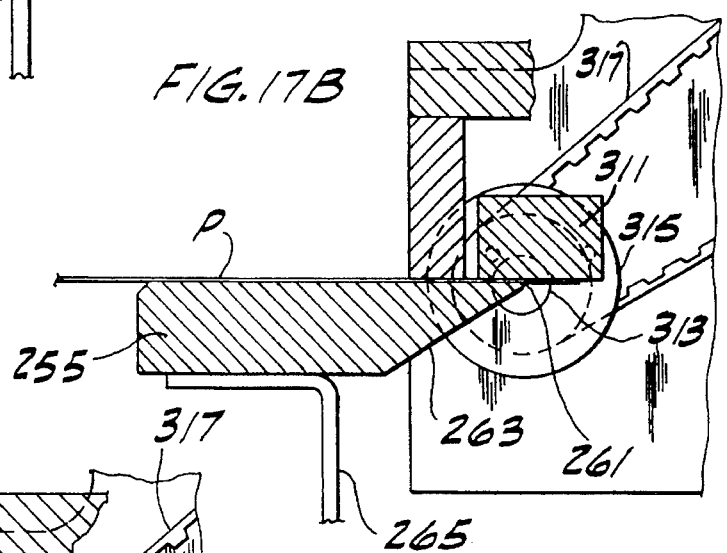
Figure 17C:
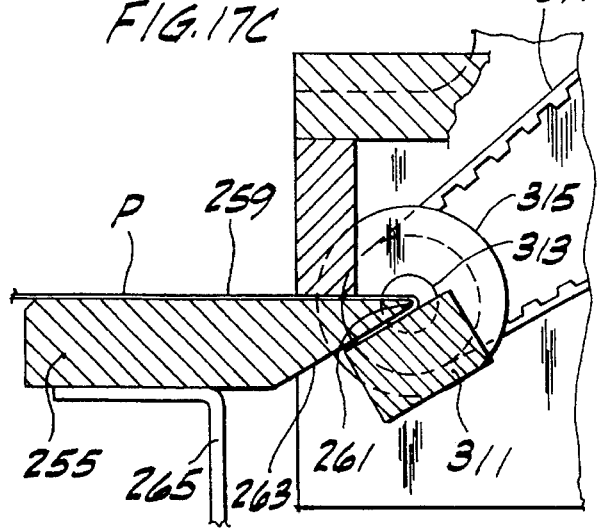

After the positioning system 53 has positioned the plate in its final position, the computer 191 signals the screw shaft stepper motors 277 to move the punching and bending units 55, 57 inwardly toward one another into their respective punching positions. Upon arrival of the units in these positions, the PLC activates the punch cylinders 305 to punch notches 15, 17 in respective ends of the plate. The subframes 291 of the punch and bending units are in their raised positions during this punching operation (i.e., the subframe cylinders 293 are retracted). As the punch cylinders 305 retract at the end of a punching stroke, a switch is actuated, which signals the PLC to actuate the screw shaft stepper motors 277 to move the punching and bending units 55, 57 closer toward one another to a first bend position (FIG. 16C) in which the distance between the bending edges 261 of the mandrels 255 corresponds to the desired distance between bends B1 and B2A of the finished plate. Upon arrival of the bending mandrels 255 at the stated first bending position, cylinders 293 are actuated to lower the subframes 291 to move the bending bar 311 on each subframe from the position shown in FIG. 17A to the position shown in FIG. 17B, following which the bending bar stepper motors 331 are operated to rotate the bending bars 311 through predetermined angles of rotation corresponding to the angles at which the press mounting flanges 7, 9 are to be bent along bend lines B1 and B2A. As illustrated in FIG. 17C, the plate P1 is bent about the bending edge 261 of each mandrel during such rotation of the bending bars. After the bending bars have been rotated to form the flanges 7, 9, the bending bar stepper motors 331 reverse direction to return the bending bars to their respective home positions (FIG. 17B).

As previously mentioned, the tail end mounting flange 9 of a plate P may be formed by two bends (e.g., bends B2A and B2B). Bend B2A is formed first as described above. To form bend B2B, the punching and bending unit 57 adjacent the tail (rear) end of the plate is moved forward (toward the front mandrel) to a second bending position in which the bending edge of the mandrel is positioned for forming bend B2B in the plate (see FIG. 16D). The latter bend is formed in the same manner as bend B2A. Since the punching and bending units 55, 57 are operable totally independent of one another by their own stepper motors, bends B2A and B2B can be formed while the forward bend B1 is being made (bend B1 will generally require more time to make then either bend B2A or bend B2B since the front end flange 7 is bent at a much greater angle then than the rear end flange 9).

After the plate has been bent to form the mounting flanges 7, 9, the cylinders 293 are activated to raise the subframes 291, and the stepper motors 277 are operated to move respective punching and bending units 55, 57 closer toward one another by a distance sufficient to clear the mandrels 255 from the front and rear mounting flanges just formed on the plate (see FIG. 16E). Cylinders 117, 119 are then activated to raise the inspection station conveyor frame 107 carrying belts 103 to lift the plate off the vacuum table 47 for conveyance from the inspection station. The upper reaches of the belts remain in a generally horizontal plane during the initial stages of upward movement by the belts. However, during the later the stages of this movement, cylinder 133 is operable to tilt the rear end of the conveyor frame upwardly as shown in FIG. 16E. This facilitates conveyance of the plate P1 from the inspection station.

After the plate has exited the inspection station, as detected by photosensor 145, the stepper motors are instructed by the computer 191 to return to their respective home positions. Among other things, this causes the vacuum table positioning system 53 to return to its home position for accepting the next plate P2, and the punching and bending units 55, 57 to move away from one another back to their respective home positions. Following a predetermined time delay after conveyance of the plate P1 from the inspection station 45, the exit stops 141 and lateral positioning stops 153 are raised to their stopping positions, and the entry conveyor stops 93A, 93B are lowered to permit plate P2 to be conveyed to the inspection station 45. The cycle then repeats.

The ability of the present invention to punch and bend a plate to "match" a particular press on which the plate is to be mounted is a significant improvement over prior art automatic benders, which have heretofore not been able to take press idiosyncrasies into account when bending a plate. By punching and bending a plate to fit the particular press on which it is to be mounted, any registration errors associated with that particular press can be taken into account and compensated for, so that the when the plate is mounted on the press, it prints an image which is the proper position for improved print quality.

The use of stepper motors in the apparatus of this invention also provides important advantages over prior bending equipment. For example, in prior benders, movement of the bending mechanism through the necessary angle of rotation has been effected by a complicated system of hydraulic or pneumatic cylinders and mechanical stops. Movement of the bending mandrels has also been effected by a system utilizing hydraulic or pneumatic cylinders and mechanical stops. These prior systems have not been extremely accurate and have been difficult to adjust to provide different bend angles for the plate mounting flanges 7, 9 and different bend-to-bend plate dimensions. The use of stepper motors in accordance with this invention produces bend angles and bend dimensions which are more accurate than prior systems, resulting in improved print quality. The stepper motors are also easily programmable to readily adjust the bend angle of either mounting flange and/or the bend-to-bend dimension of a plate (i.e., the distance between bend B1 and bend B2A). There is no need to adjust mechanical stops as in prior systems.

Optionally, apparatus 21 as described above can be programmed and equipped so that it can be selectively operated in one of two modes. The first mode, referred to as an inspection mode, is as described above. The second mode may be referred to as an inspection bypass mode in which there is no inspection of the plate and no automatic operation of the positioning system 53 to position the plate according to the results of the inspection. This mode is particularly useful in situations where plates are to be punched and bent (or just bent), but where there is no need for inspection of the plate prior to bending.

Figure 18:
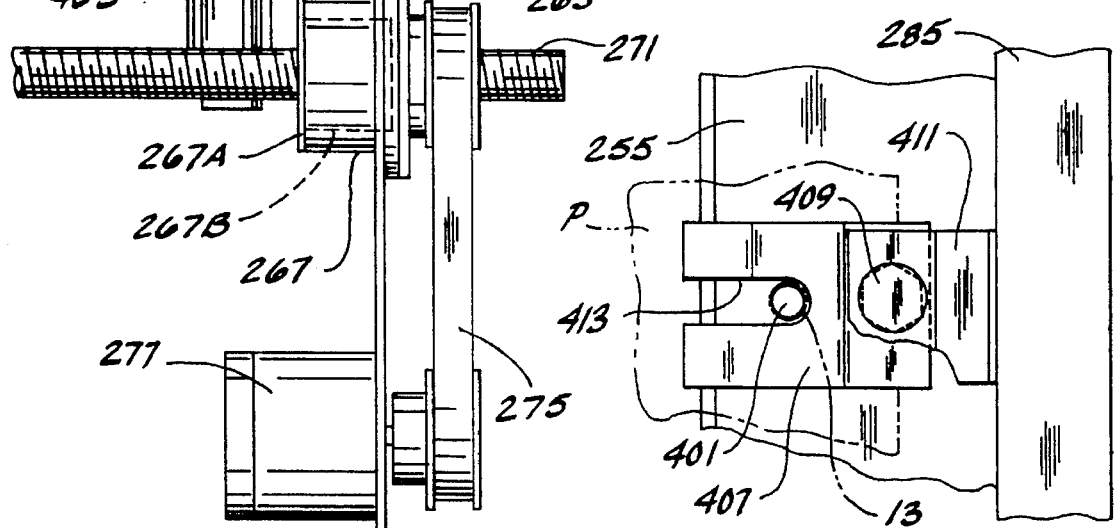
FIG. 18 is a partial plan view of a presser bar pressing a lithographic plate down on a registration pin.

In the inspection bypass mode, a second positioning means comprising a pair of registration pins, each designated 401, are mounted on the bending mandrel 255. As shown in FIGS. 7, 12 and 14, these pins are movable by respective pneumatic cylinders 403 between an extended (up) position in which they extend up from the mandrel through registration openings 11, 13 in a plate P adjacent its head end, and a retracted (down) position in which the pins are disposed below the top surface of the mandrel. Two presser bars, each designated 407, are mounted on the lower piston ends of two air-actuated cylinders 409 attached by means of brackets 111 to the cross plate 285 of the main frame 281. The cylinders 409 are operable to move the presser bars between raised positions in which they are spaced above the registration pins 401, and lowered positions in which they are engageable with portions of the plate adjacent the registration openings for pressing the plate fully down on the pins to ensure precise registration of the plate prior to the punching and bending operations. When the presser bars 407 are in the stated lowered position, the registration pins extend up through notches 413 in the pusher bars (see FIG. 18).

The inspection bypass mode of operation is identical to operation of the machine in the inspection mode except as follows. After the plate has arrived at the inspection station, and the pusher bar 155 has pushed it sideways on the table against the lateral positioning stops 153, the PLC signals the cylinders 403 to move the registration pins 401 to their extended (up) positions in which they extend up through the registration openings 11, 13 in the plate. At approximately the same time, the PLC signals cylinders 409 to move the presser bars 407 down to their lowered positions to press the plate fully down on the registration pins to ensure precise registration. The presser bars 407 immediately return to their raised position. A vacuum is then drawn to fix the plate on the table, following which the PLC signals the cylinders 403 to retract the registration pins 401. The plate is then ready to be punched, without any prior inspection of the plate by the vision system 185 or movement of the table by the positioning system 53. At this point, the punching and bending sequence described earlier is carried out.

Selection between the two modes of operation may be accomplished by inputting the appropriate instructions to the computer 191 via its keyboard. The software for running the computer 191 then controls the machine to operate in accordance with the selected mode of operation.

While the apparatus described above is fully automated, it will be understood that teachings of the present invention can also be applied to a "semi-automatic" machine in which plates are manually placed on the table 47 at the inspection station, and in which the plate is removed either manually or automatically after it has been punched and bent. It is further contemplated that the teachings of this invention are applicable to a machine which performs only a bending operation, without punching.

As various changes could be made in the above constructions and methods without departing from the scope of the invention, it is intended that all matter contained in the above description or shown in the accompanying drawings shall be interpreted as illustrative and not in a limiting sense.

What is claimed is:

1. Apparatus for bending a series of lithographic plates, each plate having an image thereon, comprising a table for supporting a plate of said series of plates at an inspection station, a holding mechanism for holding a plate of said series of plates in fixed position relative to the table, an inspection system for (a) inspecting a plate of said series of plates held on the table at the inspection station, (b) determining the extent to which the plate needs to be adjusted relative to a predetermined reference position, and (c) generating a signal indicative of any such adjustment, a first positioning mechanism responsive to said signal for automatically moving the table to position a plate of said series of plates on the table for a bending operation, a second positioning mechanism for positioning a plate of said series of plates on the table for a bending operation, a bending mechanism for bending a plate of said series of plates on the table when the plate is positioned for a bending operation, and control means for selectively operating said apparatus in either an inspection mode of operation in which the inspection system and the first positioning mechanism are operable to inspect a plate of said series of plates on the table and then to move the table to position the plate for said bending operation, or in an inspection bypass mode of operation in which the second positioning mechanism positions the plate for a bending operation without prior inspection of the plate.

2. Apparatus as set forth in claim 1 wherein said second positioning mechanism comprises at least one registration pin receivable in a registration opening in a plate on the table.

3. Apparatus as set forth in claim 2 further comprising at least one presser movable in a direction generally perpendicular to a plate on the table for engagement with a portion of the plate adjacent said registration opening to press the plate fully onto said registration pin prior to the bending operation.

4. Apparatus as set forth in claim 1 further comprising a punch mechanism for punching the plate prior to operation of the bending mechanism to bend the plate.

5. Apparatus as set forth in claim 4 further comprising means for automatically conveying a series of plates, one after another, to said inspection station, and means for conveying each plate from the inspection station after the plate has been bent.

6. Apparatus as set forth in claim 1 wherein said inspection system comprises a vision system for inspecting a plate on said table at the inspection station to identify the plate by means of indicia on the plate, and to determine the position of at least one registration mark on the plate, and a computer system associated with the vision system for (a) comparing the position of said at least one registration mark to said predetermined reference position, (b) identifying a particular press on which the plate, as identified by said identifying indicia, is to be mounted, (c) determining whether said at least one registration mark is to be adjusted relative to said reference position to a compensating position to compensate for potential misalignment of the plate image on a print surface when the plate is mounted on said particular press, and (d) generating said signal indicative of any such adjustment, said first positioning means being responsive to said signal to move the table to position a plate at the inspection station in a final plate bending position in which said at least one registration mark on the plate is either in said reference position in the event it is determined there is to be no compensating adjustment, or in said compensating position if it is determined there is to be a compensating adjustment.

7. Apparatus as set forth in claim 1 wherein said first positioning means comprises a first carriage movable in a generally horizontal plane along a first axis, a second carriage mounted on the first carriage and movable relative thereto in a generally horizontal plane along a second axis generally perpendicular to the first axis, means mounting the table on the second carriage for rotation of the table relative to the second carriage about a generally vertical axis, a first stepper motor for moving the first carriage along said first axis, a second stepper motor for moving the second carriage along said second axis, and a third stepper motor for rotating said table on said vertical axis.

8. Apparatus as set forth in claim 7 wherein said bending mechanism comprises a forward bending unit positioned forward of said table for bending the head end of a plate on said table along a first bend line extending transversely with respect to the plate to form a head end mounting flange, and a rear bending unit positioned rearward of said table for bending the tail end of a plate on the table along a second bend line extending transversely with respect to the plate to form a tail end mounting flange, each bending unit comprising a carriage mounted for movement in end-to-end direction with respect to the plate, a mandrel on the carriage having a bending edge extending transversely with respect to the plate, and a bending bar on the carriage movable relative to the mandrel to bend a respective end of the plate about the bending edge of the mandrel to form a respective mounting flange, and stepper motor means for moving the bending units toward and away from one another to adjust the distance between the mandrels to vary the dimension from said first bend to said second bend of a plate.

9. Apparatus as set forth in claim 8 wherein each carriage comprises a main frame and a subframe mounted on the main frame for up and down movement relative to the main frame between raised and lowered positions, and wherein said bending mandrel is mounted on the main frame and said bending bar is mounted on said subframe for up and down movement relative to the bending mandrel.

10. Apparatus as set forth in claim 8 wherein each bending bar is mounted for rotation about an axis extending lengthwise of the bar and parallel to the bending edge of its respective mandrel, and stepper motor means for rotating said bending bar through a predetermined angle to bend the plate to form a respective flange extending at a predetermined angle relative to the plate.

* * * * *